United States Patent
Wang et al.

(10) Patent No.: US 10,795,098 B2
(45) Date of Patent: Oct. 6, 2020

(54) MODE DIVISION MULTIPLEXING USING VERTICAL-CAVITY SURFACE EMITTING LASERS

(71) Applicant: HEWLETT PACKARD ENTERPRISE DEVELOPMENT LP, Houston, TX (US)

(72) Inventors: Binhao Wang, Palo Alto, CA (US); Wayne V. Sorin, Palo Alto, CA (US); Michael R. Tan, Palo Alto, CA (US); Stanley Cheung, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 87 days.

(21) Appl. No.: 16/229,967

(22) Filed: Dec. 21, 2018

(65) Prior Publication Data
US 2020/0200985 A1    Jun. 25, 2020

(51) Int. Cl.
| | |
|---|---|
| *G02B 6/293* | (2006.01) |
| *H04B 10/40* | (2013.01) |
| *G02B 6/42* | (2006.01) |
| *H04J 14/04* | (2006.01) |
| *H01S 5/14* | (2006.01) |

(52) U.S. Cl.
CPC ........ *G02B 6/4215* (2013.01); *G02B 6/29311* (2013.01); *G02B 6/29386* (2013.01); *H01S 5/141* (2013.01); *H04B 10/40* (2013.01); *H04J 14/04* (2013.01)

(58) Field of Classification Search
CPC .............. G02B 6/4215; G02B 6/29386; G02B 6/29311; H04B 10/40; H04J 14/04; H01S 5/141
See application file for complete search history.

(56) References Cited

U.S. PATENT DOCUMENTS

| | | |
|---|---|---|
| 9,413,448 B2 | 8/2016 | Ashrafi et al. |
| 9,859,981 B2 | 1/2018 | Ashrafi et al. |
| 2015/0010271 A1* | 1/2015 | Fattal ................ H01S 5/423 385/14 |

OTHER PUBLICATIONS

Amphawan, A.: "Laguerre-Gaussian mode division multiplexing in multimode fiber using SLMs in VCSEL arrays"; Sep. 5, 2016; 35 pages.

* cited by examiner

*Primary Examiner* — Thanh Luu
(74) *Attorney, Agent, or Firm* — Nolte Intellectual Property Law Group

(57) ABSTRACT

A VCSEL transmitter includes a first VCSEL terminal disposed on a substrate and a second VCSEL terminal adjacent thereto. The transmitter also includes a first diffraction element within a first optical path of the first VCSEL terminal which receives and changes a first direction of a first light transmission having a low-order Laguerre Gaussian mode emitted from the first VCSEL terminal. The transmitter further includes a second diffraction element within a second optical path of the second VCSEL terminal which receives the second light transmission and converts the received light into a high-order Laguerre Gaussian mode. The transmitter also includes a mode combiner to direct the first light transmission into a lens which directs the light into a multi-mode optical fiber.

10 Claims, 18 Drawing Sheets

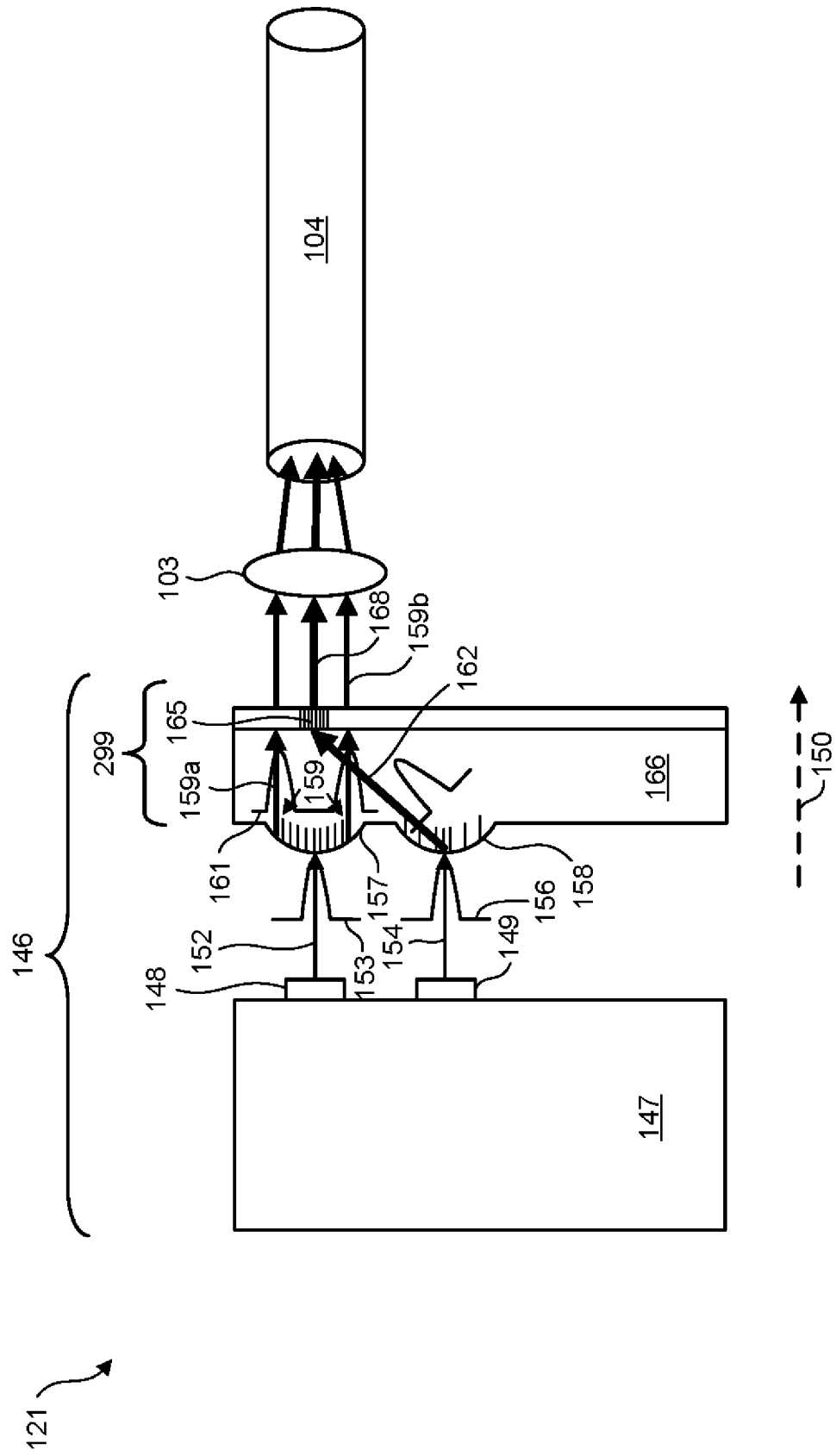

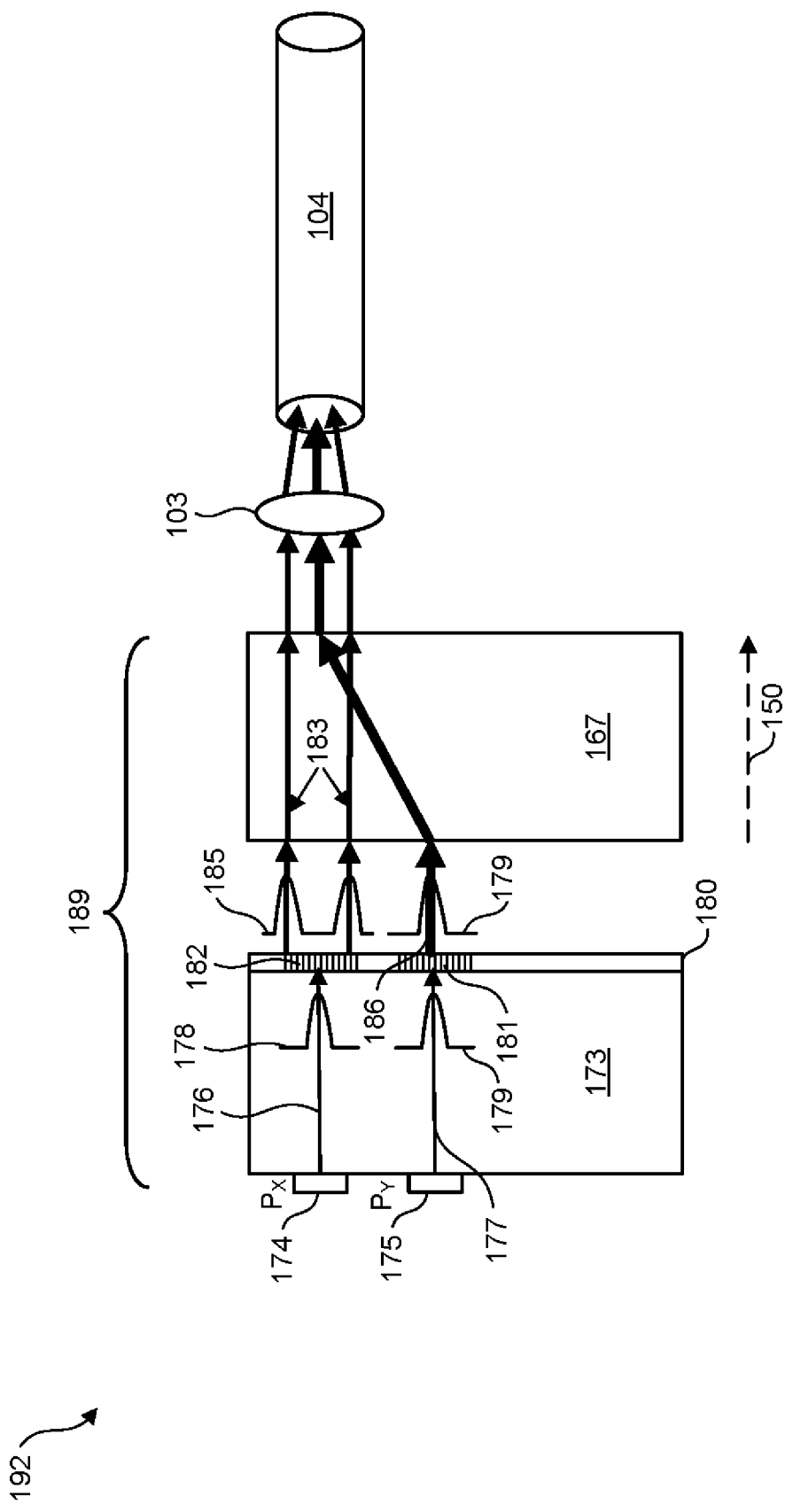

MODE DIVISION MULTIPLEXING USING VERTICAL-CAVITY SURFACE EMITTING LASERS

BACKGROUND

High-speed data center interconnects leverage the ongoing development of ultrafast optical transceivers to meet the traffic demands in data centers and other high-end network environments. To meet these demands, some data centers incorporate high bandwidth density and low-cost solutions.

For example, coarse Wavelength Division Multiplexing (CWDM) has been implemented in multi-mode vertical-cavity surface-emitting laser (VCSEL) fiber transmission systems to increase link bandwidth density. However, multi-mode VCSEL fiber transmission systems which implement CWDM are often limited to transmissions of four signals per optical fiber.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 6A is an illustration of a top-emitting VCSEL transmission system which implements mode division multiplexing, according to one or more implementations of the present disclosure.

FIG. 7A is an illustration of a VCSEL transmission system that implements mode division multiplexing using polarized VCSEL terminals and a polarization combiner device, according to one or more implementations of the present disclosure.

DETAILED DESCRIPTION

Figure 1:
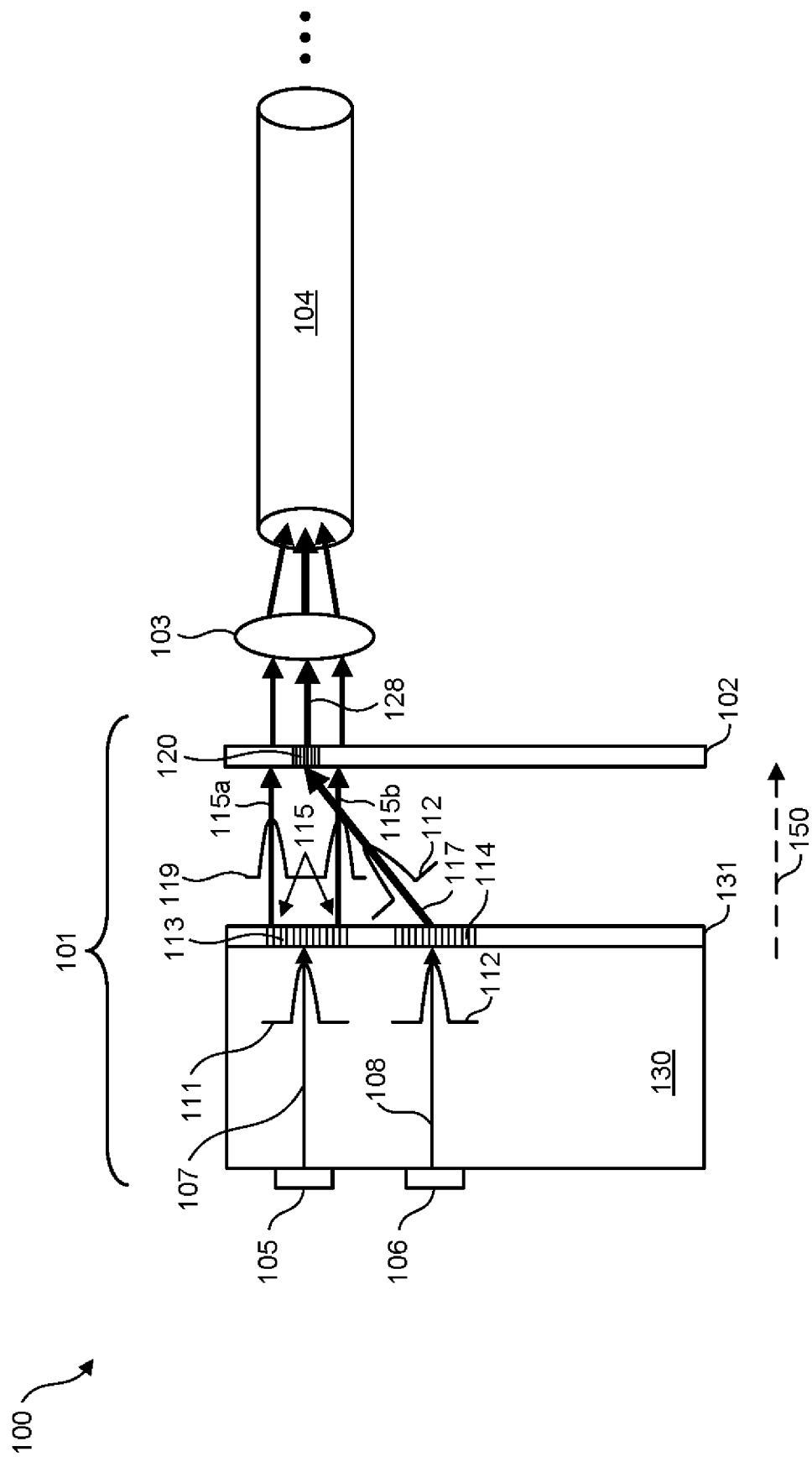
FIG. 1 is an illustration of a bottom-emitting VCSEL transmission system which implements mode division multiplexing according to one or more implementations of the present disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more". Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure. The term "about" generally refers to ±10% of a stated value.

Mode Division Multiplexing (MDM) can double the bandwidth of computing systems. With the addition of Wavelength Division Multiplexing (WDM), transceiver systems can increase the bandwidth density even more. The employment of MDM transceiver systems within high-performance computing systems and data centers has not achieved widespread commercial use due to the relatively high costs of complementary mode converter and combiner devices. In addition, although CWDM has been implemented in multi-mode VCSEL fiber transmission systems to increase link bandwidth density, these systems are often limited to transmissions of four signals per optical fiber.

The present disclosure provides a relatively inexpensive and scalable VCSEL transceiver system which implements MDM or both MDM and WDM. Herein, a VCSEL is defined as a semiconductor laser which has an optical cavity that is oriented perpendicularly to the semiconductor substrate. VCSELs emit light from a top or bottom surface, enabling simple wafer-level testing of devices. Advantageously, the VCSELs can modulate at frequencies greater than 50-100 Gbps and are useful for high-speed communications and precision sensing applications. Top-emitting VCSELs are often used to emanate light with wavelengths that are between 840-940 nm. For example, 850, 880, 910, and 940 nm top-emitting VCSELs may be used to transmit four-color CWDM signals. Moreover, bottom-emitting VCSELs are often employed to emanate light with wavelengths that are between 990 and 1065 nm. For example, 990, 1015, 1040, and 1065 nm bottom-emitting VCSELs may be used to transmit optical signals for bottom emitting CWDM systems.

Herein, a VCSEL transceiver system is defined as a system of optical and electronic components that includes an optical transmitter and receiver integrated a single module. The transceiver system may include the following: VCSELs, mode combiners, mode converters, mode splitters, polarization combiners, optical lenses, optical fibers, photodetectors multiplexers, and demultiplexers. A VCSEL transceiver system described herein may employ both MDM and WDM to further enhance link bandwidths. In addition, a VCSEL transmitter of the transceiver system may include an eight, twelve, or sixteen-fiber ribbon array for increased bandwidth for high performance computers and mega-data centers. It should be understood by one having ordinary skill in the art that any of the transmitters and receivers as described herein may be combined or integrated within or to form a VCSEL transceiver. Such transmitters and receivers may instead or additionally be coupled to opposing ends of an optical fiber such that optical signals transmitted by a transmitter may be received by a corresponding receiver via the optical fiber.

As described in more detail below, the VCSEL transmission system may also incorporate dielectric high-contrast sub-wavelength grating structures which can collimate (e.g., focus), change the direction of light, or change the mode of light emitted by the VCSELs. The grating structures can be used to combine or split emitted light within the VCSEL transmission system as well. The present disclosure provides a VCSEL transmission system. The VCSEL transmission system includes a transmitter. The transmitter includes a first VCSEL terminal disposed on a substrate and a second VCSEL terminal adjacent thereto. The transmitter further includes a first diffraction element within a first optical path of the first VCSEL terminal which receives and changes a first direction of a first light transmission having a low-order Laguerre Gaussian mode emitted from the first VCSEL terminal. The transmitter further includes a second diffraction element within a second optical path of the second VCSEL terminal which receives and converts the second light transmission into a high-order Laguerre Gaussian mode. The transmitter also includes a mode combiner to direct the first light transmission into a lens which directs the light to a multi-mode optical fiber. In addition, the VCSEL transmission system further includes a lens and a multi-mode optical fiber.

The present disclosure further provides a VCSEL transmission system which implements mode division multiplexing using polarized VCSEL terminals and a polarization combiner. In this implementation, a VCSEL transmission system includes a substrate and a first VCSEL terminal having a first polarization profile disposed on a first side of the substrate and a second VCSEL terminal which has a second polarization profile also disposed on the first side of the substrate. In addition, a first diffraction element is disposed on a second side of the substrate which is to receive and change the mode of a first light transmission emitted from the first VCSEL terminal. Herein, a "mode" refers to an optical path in which light travels within an optical system.

In addition, the VCSEL transmission system includes a second diffraction element which is disposed on the second side of the substrate. The second diffraction element receives and diffracts a second light transmission which has a second mode that is emitted from the second VCSEL terminal. The VCSEL transmission system also incorporates a polarization combiner that receives the first light transmission and changes the direction of the second light transmission. The VCSEL transmission system further includes a lens to receive and change the direction of the first light transmission and the second light transmission. The VCSEL transmission system also includes an optical fiber to receive the first and second light transmissions. The first light transmission propagates along the multi-mode optical fiber in a first manner characteristic with the first mode and the second light transmission propagates along the optical fiber in a second manner characteristic with the second mode.

FIG. 1 is an illustration of a bottom-emitting VCSEL transmission system 100 which implements mode division multiplexing. VCSEL transmission system 100 includes a transmitter 101 (which includes mode combiner 102), lens 103, and multi-mode optical fiber 104. VCSEL transmission system 100 multiplexes one or more optical signals within a fiber transmission link. As will be described in more detail below, current can be applied to an input of the VCSEL transmission system 100 such that photons are emitted therefrom. As described above, in some implementations, the transmission system 100 may include a receiver (e.g., as described in more detail below) as well as transmitter 101 to form an optical transceiver. In other implementations, a receiver may be optically coupled to the multi-mode optical fiber 104 opposite the transmitter 101 such that optical signals may be transmitted from the transmitter 101 to the receiver via the multi-mode optical fiber 104.

VCSEL transmission system 100 includes two VCSEL terminals 105, 106. However, the present disclosure is not limited thereto. It should be understood by one having ordinary skill in the art that a VCSEL transmission or transceiver system may have more than two VCSEL terminals so long as it does not depart from the spirit and scope of the present disclosure.

VCSEL terminals 105, 106 may be fabricated onto substrate 130. In one implementation, VCSEL terminals 105, 106 and other VCSEL terminals described in the present disclosure are epitaxially grown on a surface of the substrate 130. Substrate 130 may include gallium arsenide or any other suitable III-V semiconductor material.

VCSEL terminal 105 and VCSEL terminal 106 may be fabricated to emit the same wavelengths of light. However, the present disclosure is not limited thereto. VCSEL terminal 105 may be fabricated such that it emits light which has a different wavelength than that of VCSEL terminal 106. In one implementation, VCSEL terminals 105, 106 may be fabricated such that they have different internal gratings (not separately shown) such that they emit light with different wavelengths.

When electrical signals are applied to VCSELs 105, 106, they are converted to optical signals in the form of emitted light (i.e., light beams 107, 108). The light emitted from the bottom emitting VCSEL terminals 105, 106 may each have a wavelength of about 980 nm. In some implementations, the light beams 107, 108 emitted from VSCELs 105, 106 may have characteristic Gaussian modes 111, 112, respectively. Herein, a Gaussian mode is a characteristic of an optical beam of monochromatic electromagnetic radiation whose transverse magnetic and electric field amplitude profiles are given by a Gaussian intensity profile. In the implementation shown, Gaussian modes 111, 112 are both low-order Laguerre Gaussian modes.

VSCELs 105, 106 can generate and emit light pulses which have a specific orbital angular momentum (OAM). For example, Gaussian modes 111, 112 are zero-order ($L_0$) Gaussian modes. In addition, as will be described below, VSCELs described herein may generate and emit light beams with high-order Laguerre Gaussian modes. The Laguerre Gaussian mode determines the manner in which the light beam propagates through an optical fiber. In one implementation, a high-order Laguerre Gaussian mode is defined as light that has a Laguerre Gaussian mode that is greater than or equal to five (e.g., fifth, sixth, seventh, eighth, ninth, or tenth-order) and a low-order Laguerre Gaussian mode is defined as light that has a Laguerre Gaussian mode that is less than five (e.g., zero, first, second, third, or fourth-order).

VCSELs 105, 106 emit light beams 107, 108, respectively, in a direction 150 through substrate 130 towards diffraction elements 113, 114, respectively, near a top region 131 of the substrate 130. Herein, a diffraction element can collimate light, convert the mode of light, or change the direction of light.

In one implementation, diffraction elements 113, 114 each include a grating structure. Herein, a grating structure is an optical device which includes a surface ruled with close, equidistant, and parallel lines to resolve light into a spectra. The lines on a grating structure may be made by any suitable method known in the art to fashion very fine, shallow lines onto a highly polished surface of light within a fiber transmission system.

In one implementation, diffraction elements 113, 114 include transmission gratings. Herein, a transmission grating is a grating structure which allows photons to pass therethrough. In some implementations, diffraction elements 113, 114 are etched into a top region 131 of substrate 130. Diffraction elements 113, 114 can collimate, focus, change direction, and/or convert the modes of light beams 107, 108. Herein, collimating light is defined as making rays of light accurately aligned and parallel.

For example, diffraction element 113 collimates and changes the mode of light beam 107. In the implementation shown, diffraction element 113 changes the mode of light beam 107 from a low-order Laguerre Gaussian mode 111 to a high-order Laguerre Gaussian mode 119. In one implementation, diffraction element 113 changes the mode of light beam 107 from a zero-order ($L_0$) Laguerre Gaussian mode to a tenth-order ($L_{10}$) Laguerre Gaussian mode.

In addition, diffraction element 113 changes the mode of light beam 107 resulting in high-order light beam 115 with two horizontal peaks 115a, 115b. In the embodiment shown, light peaks 115a, 115b constitute a single optical signal. One having ordinary skill in the art should appreciate that high-order light beam 115 may have a characteristic doughnut shape cross-section in a direction of propagation. In one implementation, the high-order light beam 115 propagates along the internal perimeter of an optical fiber as will be described in more detail below.

Diffraction element 114 changes direction of light beam 108. In the implementation shown, diffraction element 114 changes the direction of light beam 108 to travel towards diffraction element 120 of mode combiner 102. Herein, a mode combiner is defined as an optical device which is used to transfer light received from two or more fibers/channels with a single Laguerre Gaussian mode for each into one fiber/channel.

In addition, diffraction element 114 collimates light beam 108 (e.g., as illustrated by the intensity of low-order light beam 117) and maintains its low-order Laguerre Gaussian mode 118. It should be understood by one having ordinary skill in the art that there may be losses as light beam 108 passes through diffraction element 114 (e.g., resulting in light beam 117). Furthermore, diffraction element 114 maintains the low-order Laguerre Gaussian mode 112 of the light beam 108 (e.g., zero-order ($L_0$) Laguerre Gaussian mode).

Mode combiner 102 has transparent regions which allow high-order light beam 115 to travel therethrough. In one implementation, mode combiner 102 may be or includes glass. In the implementation shown, mode combiner 102 includes a diffraction element 120 (e.g., grating). Diffraction element 120 changes the direction of low-order light beam 117 as illustrated by low-order light beam 128.

After high-order light beam 115 and low-order light beam 117 passes through mode combiner 102, high-order light beam 115 reaches lens 103. In some implementations, lens 103 is a standard optical lens used in conventional fiber transmission systems. Lens 103 directs high-order light beam 115 and low-order light beam 117 directly into multi-mode optical fiber 104. Notably, lens 103 can operate to couple high-order light beam 115 and low-order light beam 117 into multi-mode optical fiber 104. In some implementations, lens 103 further collimates high-order light beam 115 and low-order light beam 117 before it directs the light beams into the multi-mode optical fiber 104. In addition, lens 103 may couple the light beams into the multi-mode fiber 104 with a magnification and numerical aperture for mode match with the multi-mode optical fiber 104.

Lens 103 may be a single-mode optical coupler or a multi-mode optical coupler. In the implementation shown, lens 103 is a multi-mode optical coupler. The present disclosure may employ any of various types of lenses for lens 103 so long as its use does not depart from the spirit and scope of the present disclosure. For example, lens 103 may be any of a fiber lens, ball lens, aspherical lens, spherical singlet or doublet lens, graded index lens, etc. In some implementations, lens 103 is a multi-mode, graded index lens 103. Lens 103 may comprise silicon, glass, or any other material that enables the lens 103 to effectively direct high-order light beam 115 and low-order light beam 117 into a multi-mode optical fiber 104.

Multi-mode optical fiber 104 receives the high-order light beam 115 and the low-order light beam 117 within its core (shown in FIGS. 3A and 3B) and allows the light beams 115, 117 to propagate therethrough. The length of multi-mode optical fiber 104 may extend tens or hundreds of meters in some implementations. The multi-mode optical fiber 104 may also be optically connected to a receiver or receiver system (e.g., receiver system 145) with photodetectors as described in more detail below (e.g., a computing device which has a demultiplexer) that receives and converts the optical signals associated with the high-order light beam 115 and low-order light beam 117 to electrical signals. In some implementations, high-order light beam 115 represents a discrete signal that can be converted to a single electrical signal, whereas low-order light beam 117 represents another discrete signal that can also be converted to another electrical signal by a receiver device.

Figure 2:
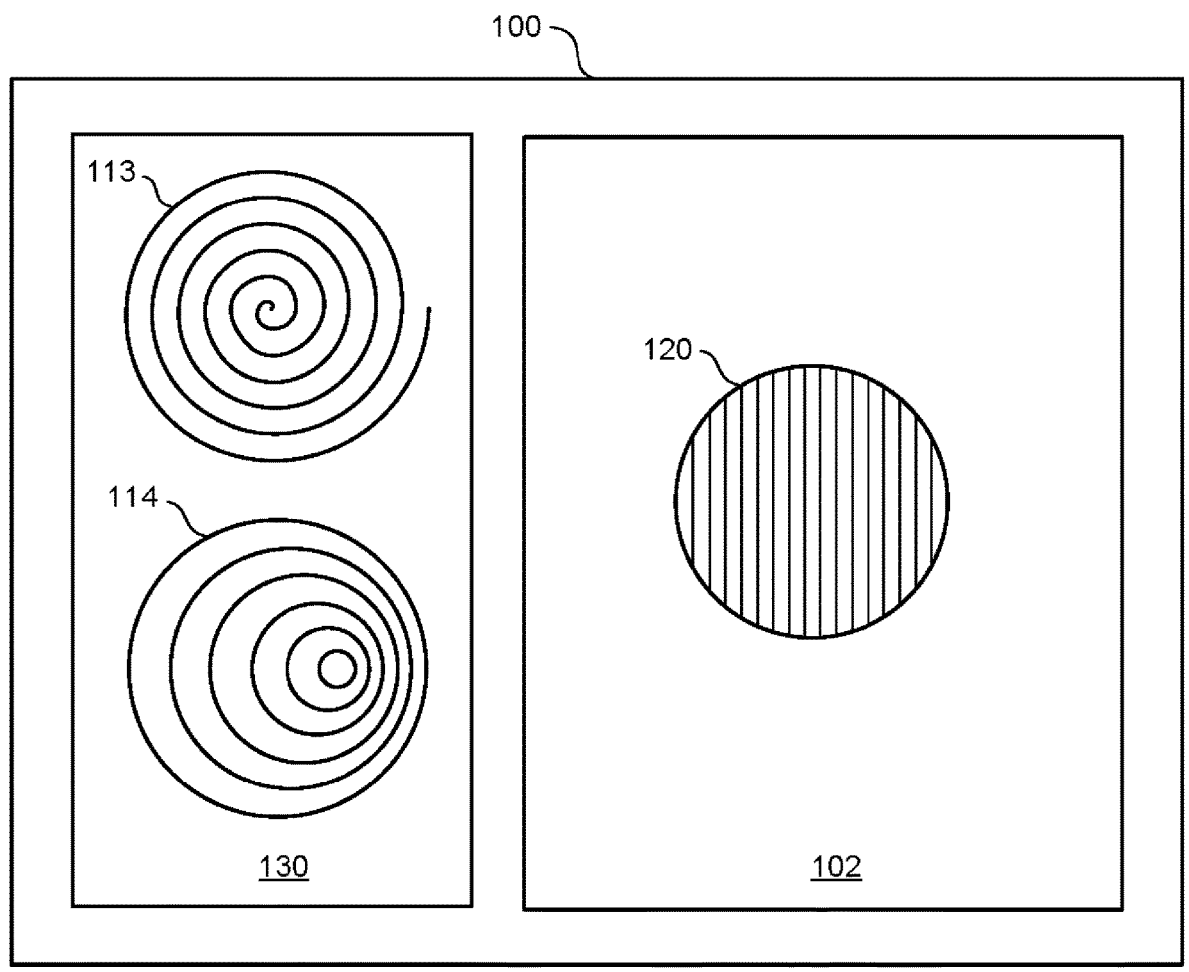
FIG. 2 is an illustration of diffraction elements disposed within a VCSEL device, according to one or more examples of the present disclosure.

FIG. 2 is an illustration of diffraction elements 113, 114, 120 disposed within a VCSEL device 100. In one implementation, diffraction element 113 and diffraction element 114 are fabricated structures within substrate 130. Diffraction element 113 includes a vortex structure whereas diffraction element 114 includes a Fresnel structure. The vortex structure enables diffraction element 113 to affect the collimation and mode conversion of light beam 107 (e.g., to high-order light beam 115). Likewise, the Fresnel structure enables diffraction element 114 to affect the collimation and direction change of light beam 108 (e.g., resulting in light beam 117).

In addition, the diffraction element 120 of mode combiner 102 may have a different fabricated structure (e.g., etch profile) than diffraction elements 113, 114. Advantageously, the fabricated structure of diffraction element 120 enables the mode combiner 102 to change the direction of low-order light beam 117.

Figure 3A:
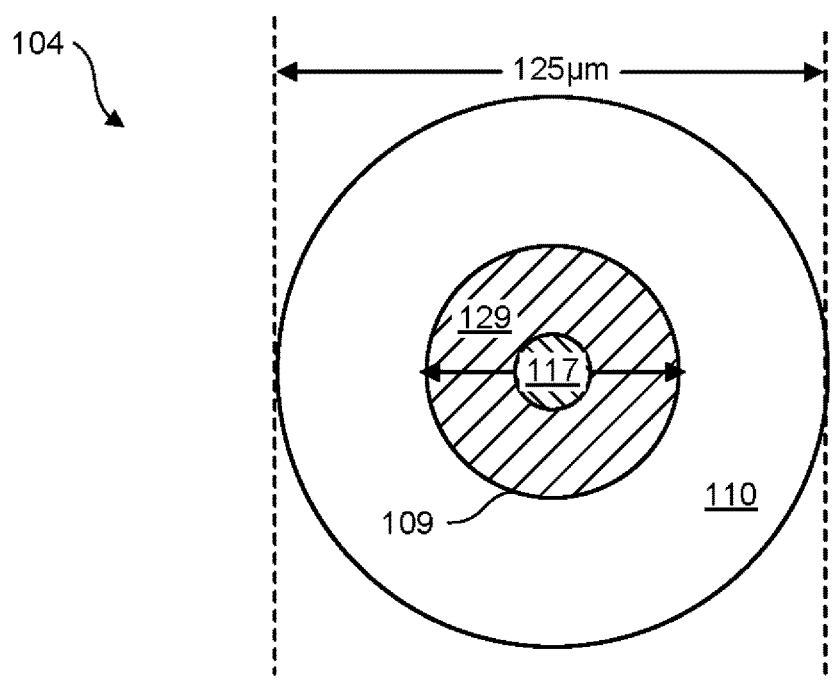
FIG. 3A is a cross-sectional view of a multi-mode optical fiber during the transmission of the signals propagating through the optical fiber and FIG. 3B is a close-up view of a portion of the multi-mode optical fiber of FIG. 3A, according to one or more examples of the present disclosure.
Figure 3B:
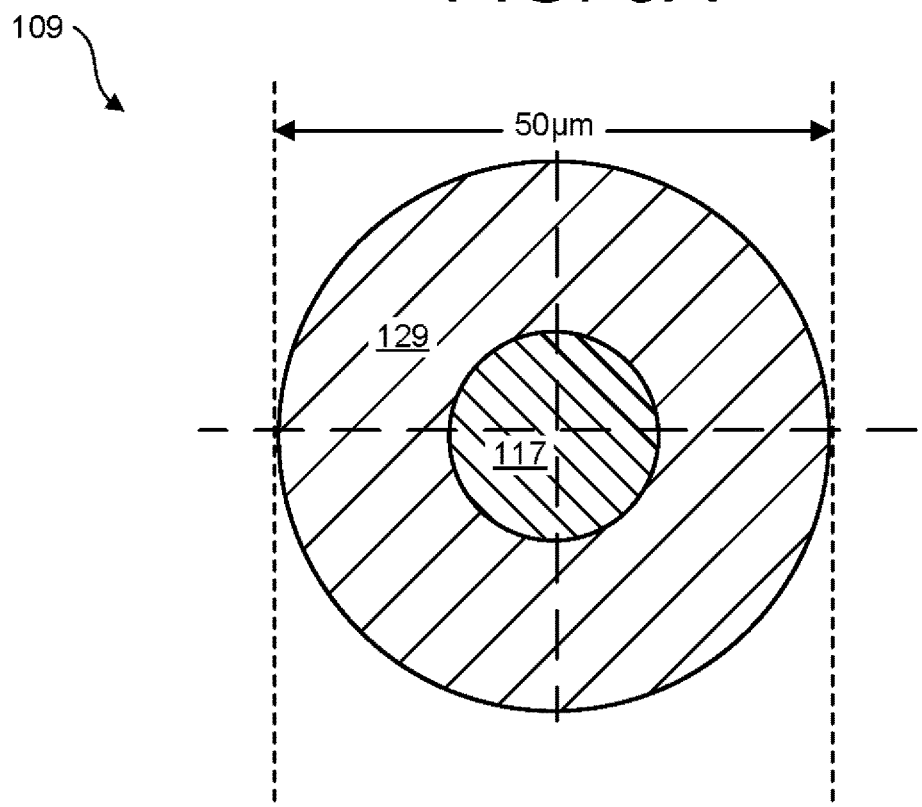

FIG. 3A is a cross-sectional view of a multi-mode optical fiber during the transmission of the signals propagating through the optical fiber and FIG. 3B is a close-up view of a portion of the multi-mode optical fiber of FIG. 3A, according to one or more examples of the present disclosure. Multi-mode optical fiber 104 enables the transmission of a plurality of modes of light which carry unique optical signals. In the implementation shown, multi-mode optical fiber 104 enables the transmission of the low-order light beam 117 and a high-order light beam 129. Notably, high-order light beam 129 includes light peaks 115a, 115b illustrated in FIG. 1. In some implementations, high-order light beam 129 may be characterized as having a doughnut shape because the propagation of high-order light beam 129 occurs near the perimeter of the core region 109.

The core region 109 of the multi-mode fiber 104 enables the transmission of light (e.g., light beams). The cladding material 110 may have a lower refractive index than the refractive index of the core region 109 to effectively contain the transmitted light (e.g., high-order light beam 115 and low-order light beam 117). In addition, the multi-mode optical fiber 104 includes a coating (not separately shown) disposed on the cladding material 110. In one implementation, core region 109 is approximately 50 microns in diameter whereas the diameter of multi-mode optical fiber 104 is approximately 125 microns in diameter.

As discussed, the high-order light beam 115 propagates along the perimeter of the core region 109, as shown in FIG. 3B, characteristic of a high-order Laguerre Gaussian mode. In contrast, low-order light beam 117 propagates through the center of the core region 109 as being characteristic of a low-order Laguerre Gaussian mode.

Figure 4:
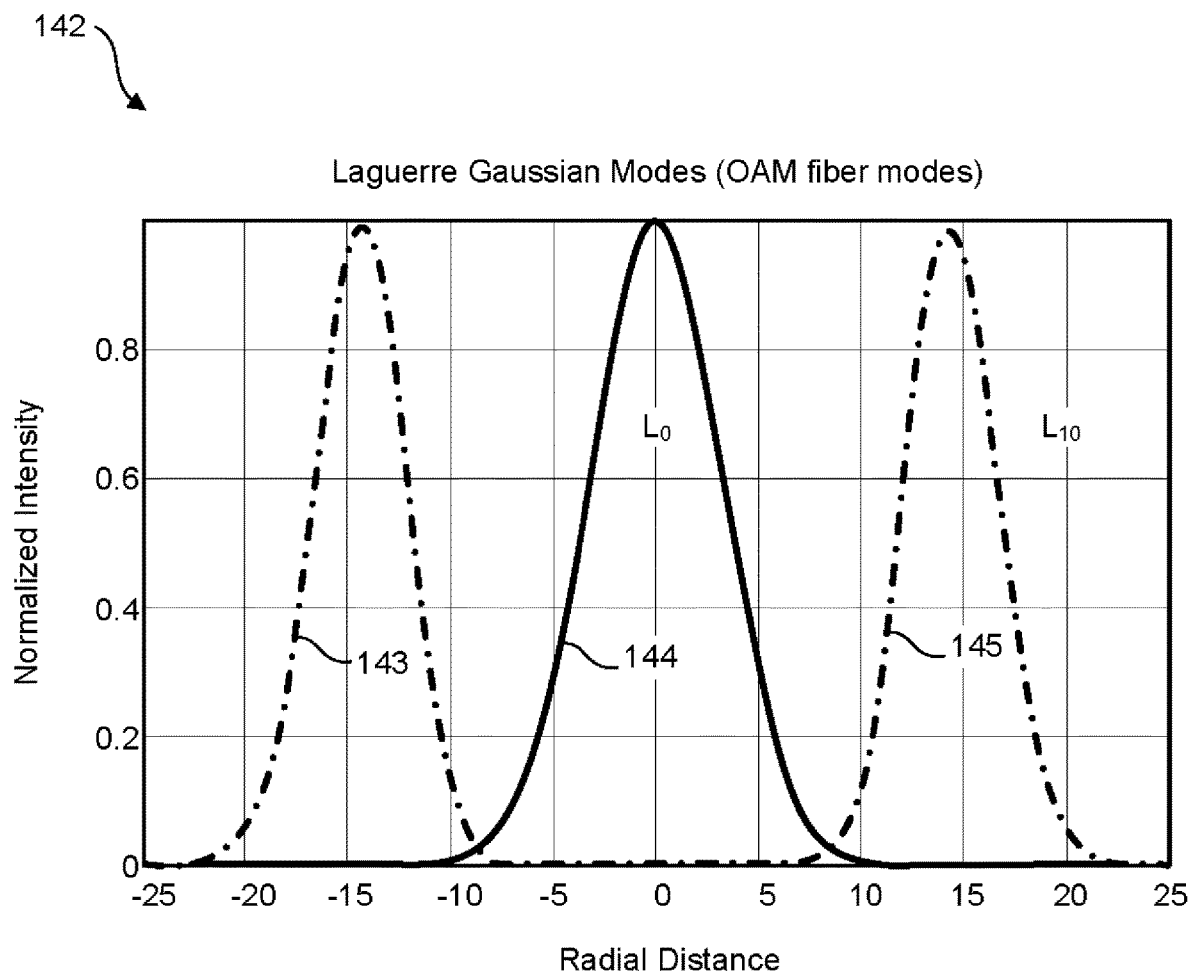
FIG. 4 is a graph which illustrates high-order and low-order Laguerre Gaussian curves, according to one or more implementations of the present disclosure.

FIG. 4 is a graph 142 which illustrates high-order and low order Laguerre Gaussian curves. In particular, graph 142 illustrates the Laguerre Gaussian modes associated with the orbital angular momentum (OAM) of light. One having ordinary skill in the art should appreciate that the OAM of light emerges as a result of a spatially-varying amplitude and phase distribution. Light beams with OAM have a twisted or helical phase structure where the phase winds azimuthally around the optical axis. A pulse or beam of light has a characteristic linear momentum and therefore can be attributed to OAM.

Graph 142 displays a zero-order ($L_0$) Laguerre Gaussian mode curve 144 and tenth-order ($L_{10}$) Laguerre Gaussian mode curves 143, 145. In one implementation, the zero-order ($L_0$) Laguerre Gaussian mode curve 144 corresponds to low-order light beam 117 that is illustrated in FIG. 1 whereas tenth-order Laguerre Gaussian mode curves 143, 145 correspond to high-order light beam 115 as illustrated in FIG. 1.

Referring back to FIG. 1, it should be understood that the present disclosure is not limited to a diffraction element to convert the mode of an emitted light beam. In some implementations, the mode conversion that increases the angular momentum of emitted light through the VCSEL transmission system may be partially implemented by VCSEL terminals and partially implemented by diffraction elements.

For example, referring back to FIG. 1, VCSEL terminal 105 may emit light with a fourth-order Laguerre Gaussian mode (e.g., greater than zero-order) and diffraction element 113 can be used to convert the fourth-order Laguerre Gaussian mode to a tenth-order Laguerre Gaussian mode. Accordingly, diffraction element 113 can convert the light (e.g., light 107) that passes therethrough another six orders.

Accordingly, the VCSEL terminals described in the present disclosure may be fabricated such that they emit light with a high or low-order Laguerre Gaussian mode. In some implementations, the VCSEL terminals may be fabricated to include spiral gratings such that it diffracts the emitted light in a manner that the light has a high-order Laguerre Gaussian mode.

Figure 5:
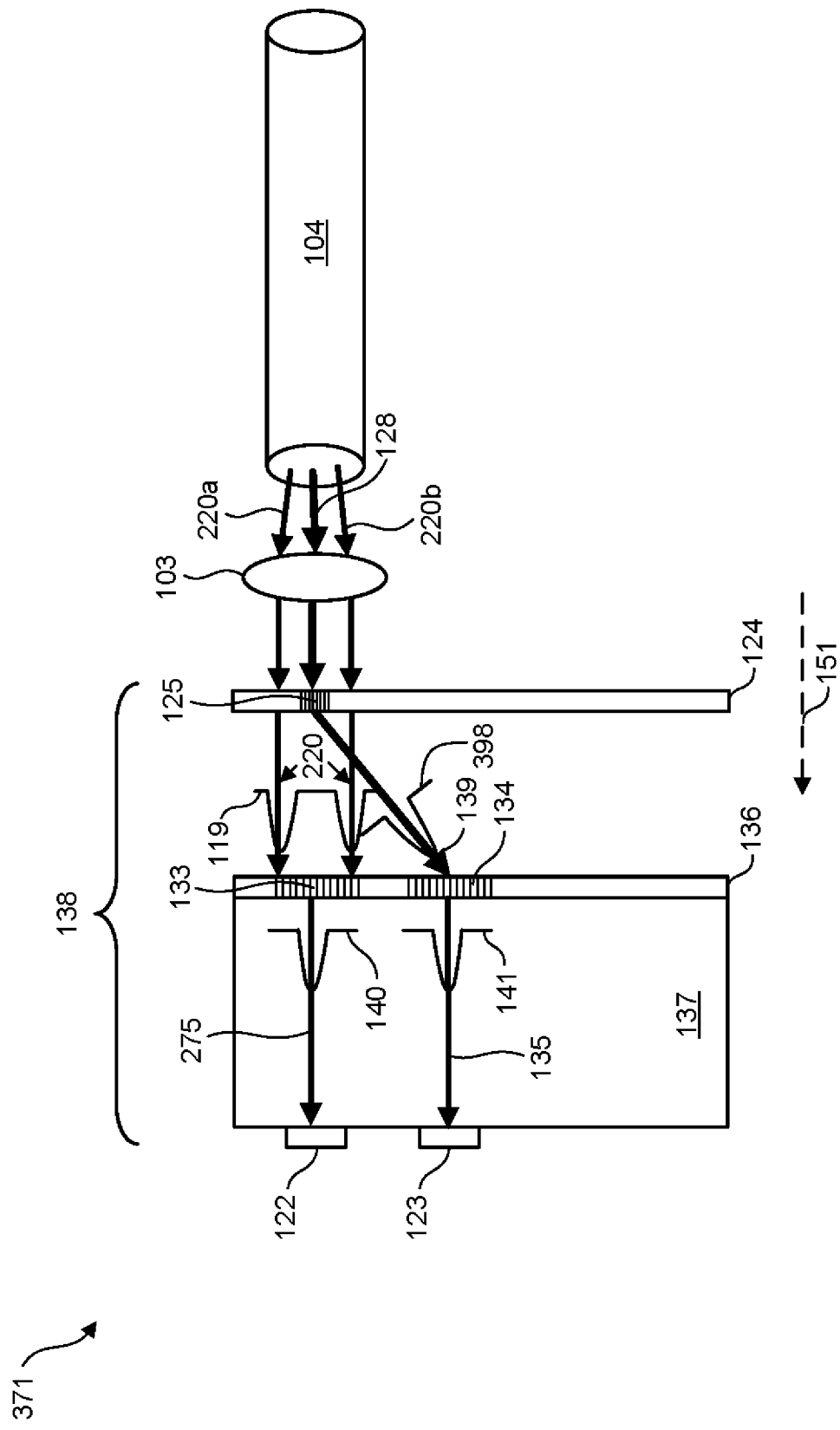
FIG. 5 is an illustration of receiver system, according to one or more implementations of the present disclosure.

FIG. 5 is an illustration of a receiver system 371 according to one implementation of the present disclosure. Receiver system 371 demultiplexes a plurality of optical signals within a fiber transmission link. receiver system 371 includes a receiver device 138, lens 103, and multi-mode optical fiber 104. As will be described in more detail below, photons can be applied to an input of the VCSEL receiver system 145 such that electrical current is emitted therefrom.

The receiver system 371 receives optical signals emitted from a transmitter (e.g., transmitter 101 of transmission system 100) via a multi-mode optical fiber 104 to form an optical interconnect or link (e.g., for a high-performance computer or data center). In some implementations, receiver system 371 may instead or additionally be coupled, paired, integrated or otherwise combined with a transmission system (e.g., transmission system 100) to form an optical transceiver. In the implementation shown, light beams 128, 220 propagate through multi-mode optical fiber 104. In one implementation, high-order light beam 220 comprises light peaks 220a, 220b which constitute a single optical signal. High-order light beam 220 can be directed to a lens 103 that can direct the high-order light beam 220 to a mode splitter 124 in a direction 151. Herein, a mode splitter is defined as an optical device used to divide light from one fiber/channel with two or more Laguerre Gaussian modes into two or more fibers/channels with single Laguerre Gaussian modes for the light through each fiber/channel.

Mode splitter 124 includes a transparent region so that high-order light beam 220 can pass therethrough with minimal or no interference. As such, the high-order Laguerre Gaussian mode 119 (e.g., tenth-order Laguerre Gaussian mode) of high-order light beam 220 is maintained until reaching diffraction element 133 disposed within a bottom region 136 of photodetector substrate 137.

Diffraction element 133 can convert light beam 220 from the high-order Laguerre Gaussian mode 119 to a low-order Laguerre Gaussian mode 140. In the implementation shown, low-order Laguerre Gaussian mode 140 is a zero-order ($L_O$) Laguerre Gaussian mode. Additionally, light beam 220 includes light peaks 220a, 220b resulting in light beam 275. After light beam 275 reaches photodetector 122, it is converted into an electrical signal (e.g., electrical current).

Likewise, light beam 128 is directed from multi-mode optical fiber 104 to lens 103. Lens 103 may direct light beam 128 to diffraction element 125 of mode splitter 124 which allows light therefrom to pass therethrough although there may be losses (e.g., resulting in light beam 139). In the implementation shown, diffraction element 125 is a transmission grating.

Diffraction element 125 changes the direction of light beam 128 towards diffraction element 134. In some implementations, there may be losses after light beam 128 contacts diffraction element 125 such that the resulting light beam 139 is directed towards diffraction element 13 which is disposed within a bottom region 136 of photodetector substrate 137. In addition, light beam 128 is shown to have a low-order Laguerre Gaussian mode 398 (e.g., zero-order Laguerre Gaussian mode). As light beam 139 passes through diffraction element 134, the diffraction element 134 maintains the low-order Laguerre Gaussian mode 118 of the light beam 139 although there may be losses resulting in light beam 135. Once light beam 135 reaches photodetector 123, it is converted to an electrical signal (e.g., electrical current).

The optical signals that are converted to electrical signals by the photodetectors 122, 123, disposed on one end of photodetector substrate 137, can be read by an external device. Photodetectors 122, 123 can therefore modulate at frequencies up to or greater than 100 Gbps and are useful for high-speed communications and precision sensing applications.

Notably, the receiver system 371 may be integrated in a module that also hosts any of the VCSEL transmission systems described herein to operate as a VCSEL transceiver system. For example, receiver system 371 may be paired with the VCSEL transmission system 100 illustrated in FIG. 1 in a single module to operate as a VCSEL transceiver system.

FIG. 6A is an illustration of a top-emitting VCSEL transmission system 121 which implements mode division multiplexing. VCSEL transmission system 121 multiplexes two or more optical signals within a fiber transmission link. As will be described in more detail below, current can be applied to an input of the VCSEL transmission system 121 such that photons are emitted therefrom.

A top-emitting VCSEL transmitter 146 can transmit optical signals through a multi-mode optical fiber 104 in a direction 150. Top-emitting VCSEL transmitter 146 includes VCSEL substrate 147 with VCSEL terminals 148, 149 disposed thereon. VCSEL terminal 148 emits light beam 152 and VCSEL terminal 149 emits light beam 154. In one implementation, VCSEL terminals 148, 149 can emit light beams with light wavelengths that are about 850 nm. In addition, VCSEL terminals 148, 149 may be fabricated such that they emit light beams 152, 154 with low-order Laguerre Gaussian modes 153, 156.

Light beam 152 is emitted from VCSEL terminal 148 to diffraction element 299 in direction 150. Notably, diffraction element 299 has built-in lens structures 157, 158 on a first end and a grating element 165 on a second end. In the implementation shown, diffraction element 165 includes a transmission grating.

In one implementation, built-in lens structures 157, 158 collimate, change the mode, and/or change the direction of light during a light's transmission through the substrate 166 of the grating element 299. In addition, diffraction element 165 collimates and/or changes the direction of light.

In the implementation shown, the lens structure 157 changes the mode of light beam 152 into a high-order Laguerre Gaussian mode 161 as light beam 152 passes through the substrate 166 of diffraction element 299. Light beam 152 is converted into a high-order light beam 159 having light peaks 159a, 159b. High-order light beam 159 passes through a transparent portion of grating element 165. As such, light peaks 159a, 159b constitute a single signal. One having ordinary skill in the art should appreciate that in some implementations high-order light beam 159 may have a characteristic doughnut shape cross-section in the direction of propagation.

Likewise, light beam 154 is emitted from VCSEL terminal 149 in direction 150 and reaches built-in lens structure 158 structure of diffraction element 299. Built-in lens structure 158 maintains the low-order Laguerre Gaussian mode 156 of the light beam 154 as it passes through the substrate 166. There may be losses as light beam 154 passes through built-in lens structure 158 resulting in light beam 162. Light beam 162 is directed towards grating element 165 (e.g., direction of light is changed by built-in lens structure 158). Grating element 165 changes the direction of light beam 162 to be directed towards lens 103. There may be losses as light beam 162 passes through grating element 165 resulting in light beam 168. After high-order light beam 159 and low-order light beam 154 passes through diffraction element 299, they reach lens 103 which directs high-order light beam 159 and low-order light beam 154 into multi-mode optical fiber 104.

It should be understood by one having ordinary skill in the art that the VCSEL transmission system 121 may be paired with a receiver system consistent with the present disclosure within a single module to operate as a VCSEL transceiver system. Additionally, or instead, an opposing end of the multi-mode optical fiber 104 opposite the transmission system 121 may be coupled to a receiver system as described herein to form an optical interconnect or link.

Figure 6B:
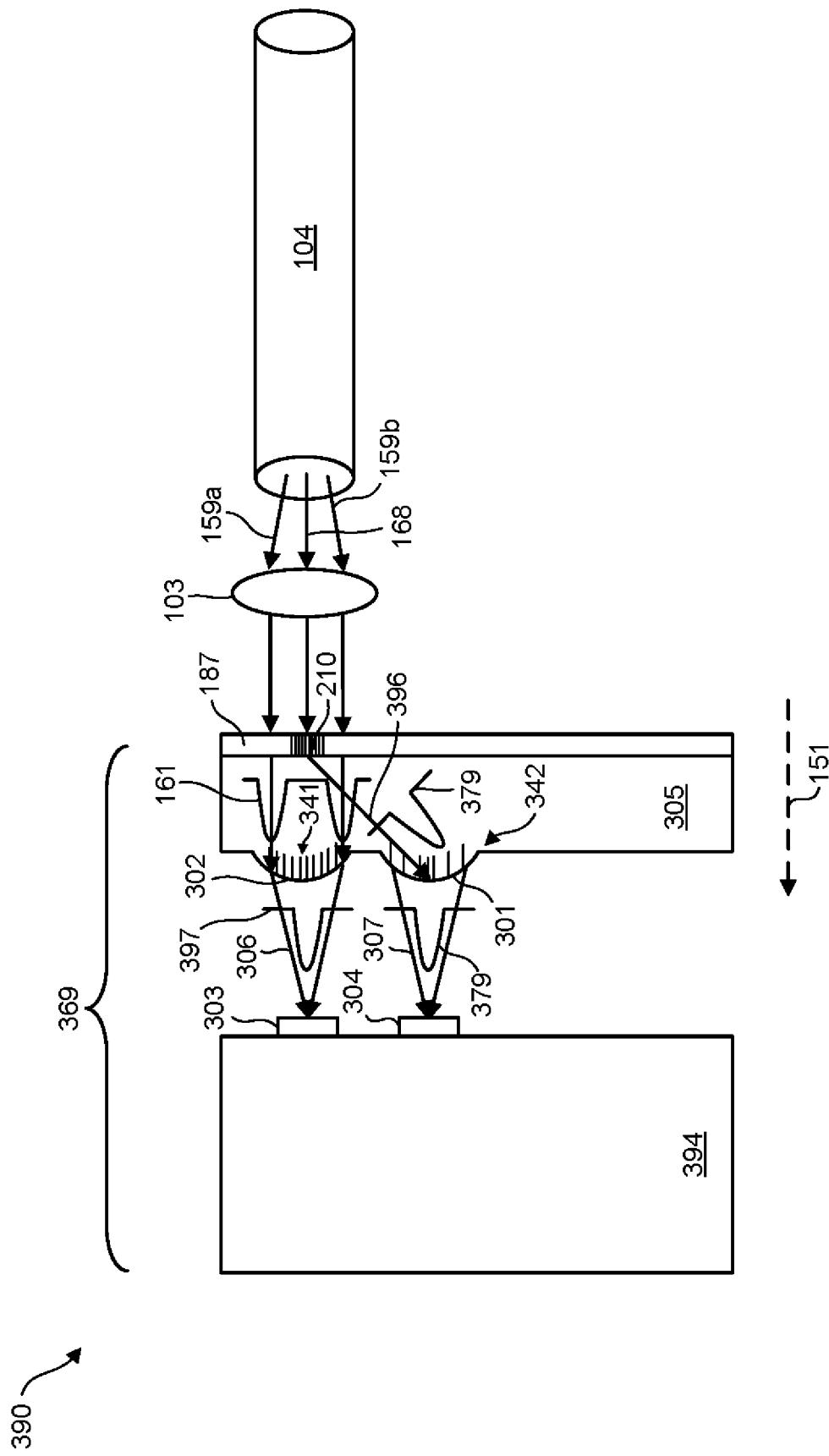
FIG. 6B is an illustration of an example receiver system for the top-emitting VCSEL shown in FIG. 6A.

FIG. 6B is an example receiver system 390 for the top-emitting VCSEL device 121 shown in FIG. 6A. Receiver system 390 demultiplexes a plurality of optical signals within a fiber transmission link. Receiver system 390 includes a receiver device 369, lens 103, and multi-mode optical fiber 104. As will be described in more detail below, photons can be applied to an input of the receiver system 390 such that electrical current is emitted therefrom.

The receiver system 390 receives optical signals emitted from a transmitter (e.g., transmitter 146 of transmission system 121) via a multi-mode optical fiber 104 to form an optical interconnect or link (e.g., for a high-performance computer or data center). In some implementations, receiver system 390 may instead or additionally be coupled, paired, integrated or otherwise combined with a transmission system (e.g., transmission system 121 shown in FIG. 6A) to form an optical transceiver. In the implementation shown, light beams 159, 168 emitted from a transmitter propagate through multi-mode optical fiber 104. In one implementation, high-order light beam 159 comprises light peaks 159a, 159b which constitute a single optical signal. High-order Laguerre Gaussian light beam 159 can be directed to a lens 103 that can direct the high-order Laguerre Gaussian light beam 159 to a mode splitter 305 in a direction 151. Mode splitter 305 includes a transparent region 187 which allows the transmission of high-order Laguerre Gaussian mode 161 of light beam 159. In addition, mode splitter 305 includes a grating 210 which maintains the low-order mode of light beam 168 but changes its direction. In the embodiment shown, grating 210 directs the light beam 168 to built-in lens structure 301. As there may be losses as light beam 168 travels across the grating 210, the resulting signal may be represented as light beam 396.

Light beam 159 reaches built-in lens structure 302 which includes transmission gratings 341. Built-in lens structure 302 collimates light beam 168 and changes the higher-order Laguerre Gaussian mode 161 of light beam 159 to a low-order Laguerre Gaussian mode 397. There may be losses as light beam 159 passes through lens 302 resulting in light beam 306. Light beam 306 may be detected by photodetector 303 (disposed on substrate 394) which converts the optical signal to an electrical signal. In the embodiment shown, photodetectors 303, 304 are disposed on a bottom side of the photodetector substrate 394. However, the present disclosure is not limited thereto. In some implementations, photodetectors 303, 304 may be disposed on a top or bottom side of the photodetector substrate 394.

Likewise, light beam 168 reaches lens 301 which includes transmission gratings 342 which collimates and changes the direction of light beam 168. Notably, built-in lens structure 301 maintains the low-order Laguerre Gaussian mode 379 of light beam 168. As there may be losses as light beam 168 passes through built-in lens structure 301, the resulting signal may be represented as light beam 307. Light beam 307 may be detected by photodetector 304 (disposed on substrate 394) which converts the optical signal to an electrical signal.

The optical signals that are converted to electrical signals by the photodetectors 303, 304 can be read by an external device. Photodetectors 303, 304 can therefore modulate at frequencies up to or greater than 100 Gbps and are useful for high-speed communications and precision sensing applications.

Notably, the receiver system 390 may be integrated in a module that also hosts any of the VCSEL transmitter systems described herein to operate as a VCSEL transceiver system. For example, receiver system 390 may be paired with the VCSEL transmitter system 121 illustrated in FIG. 6A in a single module to operate as a VCSEL transceiver system.

FIG. 7A is an illustration of a VCSEL transmission system 192 that implements mode division multiplexing using polarized VCSEL terminals 174, 175 and a polarization combiner 167 device. VCSEL transmission system 192 multiplexes one or more optical signals within the fiber transmission link. As will be described in more detail below, current can be applied to an input of the VCSEL transmission system 192 such that photons are emitted therefrom.

VCSEL transmission system 192 includes a transmitter 189, lens 103, and multi-mode optical fiber 104. Notably, VCSEL transmitter 189 includes a polarization combiner 167 that can change the direction of a light beam 186 based on the mode of the light beam 186. In one implementation, polarized VCSEL terminals 174, 175 are high-contrast grating, polarized VCSEL terminals. Accordingly, in this implementation, each VCSEL terminal 174, 175 includes a high-contrast grating to affect the polarization of light emitted therefrom. Herein, polarization is defined as a confinement of an electric field vector or magnetic field vector to a given plane along the direction of propagation. In addition, the orientation of a linearly polarized electromagnetic wave is defined by the direction of the electric field vector. For example, if the electric field is vertical, the radiation is vertically polarized whereas if the electric field is horizontal, the radiation is horizontally polarized.

As shown in the figure, VCSEL terminals 174, 175 emit light beams 176, 177 in a direction 150 towards diffraction elements 181, 182. In the implementation shown, diffraction elements 181, 182 include transmission gratings. Most notably, the light beams 176, 177 emitted from VCSEL terminals 174, 175 are polarized light. In one implementation, light beam 176 is x-polarized whereas light beam 177 is y-polarized.

In addition, diffraction elements 181, 182 are fabricated within a region 180 of substrate 173. In one implementation, substrate 173 has a high refractive index. Light beams 176, 177 may have low-order Laguerre Gaussian modes 178, 179. Diffraction element 182 changes the mode of light beam 176 from low-order Laguerre Gaussian mode 178 to a high-order Laguerre Gaussian mode 185. In addition, light beam 176 is transformed into high-order light beam 183 as light beam 176 passes through diffraction element 182. High-order light beam 183 may also have the same polarization (e.g., x-polarized) as light beam 176. In contrast, diffraction element 181 can maintain the low-order Gaussian mode 179 of light beam 186 (e.g., as light beam 177 passes through the diffraction element 181 resulting in light beam 186).

Polarization combiner 167 may include a rutile material. Herein, a rutile material includes titanium dioxide ($TiO_2$). In some implementations, polarization combiner 167 has a birefringence property. Herein, birefringence is defined as the optical property of a material having a refractive index that depends on the polarization and propagation direction of light. A birefringence property is often quantified as the maximum difference between refractive indices exhibited by a material. Polarization combiner 167 may include any of several crystal forms which may bend or change the direction of light beams traversing therethrough in various ways. However, in other implementations, the polarization combiner 167 may include other birefringent materials such as yttrium orthovanadate ($YVO_4$) or quartz ($SiO_2$).

In one implementation, polarization combiner 167 maintains the direction of high-order light beam 183 in direction 150 towards lens 103 according to their polarization mode (e.g., x-polarized). In contrast, polarization combiner 167 changes the direction of light beam 186 to travel at an angle (e.g., in a 6° direction relative to horizontal) until the light beam 186 reaches an end of the polarization combiner 167. Note, the angles shown within the figures may not necessarily be to scale.

Lens 103 focuses light beams 183, 186 into multi-mode optical fiber 104 which is routed to a receiver system (e.g., an external system with a receiver) that converts the optical signals into electrical signals. In the implementation shown, high-order light beam 183 constitutes an optical signal whereas light beam 186 constitutes a different optical signal from the optical signal associated with light beam 183.

It should be understood by one having ordinary skill in the art that VCSEL transmission system 192 may be paired with a receiver system consistent with the present disclosure within a single module to operate as a VCSEL transceiver system. Additionally, or instead, an opposing end of the multi-mode optical fiber 104 opposite the transmission system 192 may be coupled to a receiver system as described herein to form an optical interconnect or link.

Figure 7B:
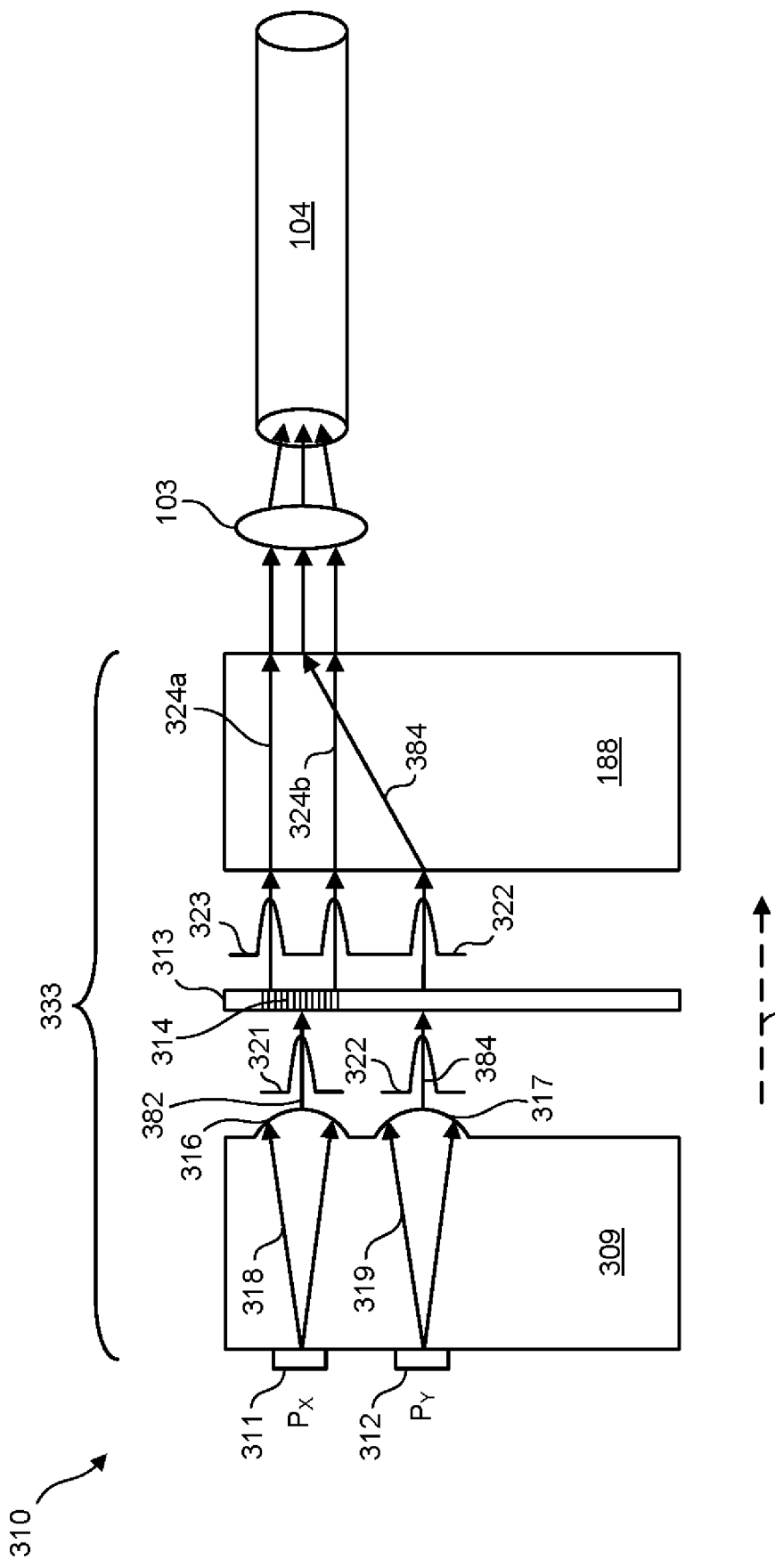
FIG. 7B is an illustration of a VCSEL transmission system that implements mode division multiplexing using polarized VCSEL terminals, a vortex grating, and a polarization combiner device, according to one or more implementations of the present disclosure.

FIG. 7B is an illustration of a VCSEL transmission system 310 that implements mode division multiplexing using polarized VCSEL terminals 311, 312, a vortex grating 314, and a polarization combiner device 188, according to one or more implementations of the present disclosure. VCSEL transmission system 310 multiplexes one or more optical signals within the fiber transmission link. As will be described in more detail below, current can be applied to an input of the VCSEL transmission system 310 such that photons are emitted therefrom.

VCSEL transmission system 310 includes a transmitter 333, lens 103, and multi-mode optical fiber 104. Notably, transmitter 189 includes a polarized VCSEL substrate 309, vortex grating 314 and a polarization combiner 188. In one implementation, polarized VCSEL terminals 311, 312 which are shown to be disposed on a substrate 309 are high-contrast grating, polarized VCSEL terminals 311, 312. Accordingly, in this implementation, each VCSEL terminal 311, 312 includes a high-contrast grating to affect the polarization of light emitted therefrom.

As shown in the figure, polarized VCSEL terminals 311, 312 emit light beams 318, 319 in a direction 150 towards built-in lens structures 316, 317. In some implementations, lenses 316, 317 include transmission gratings. Most notably, polarized VCSEL terminals 311, 312 emit polarized light. In one implementation, light beam 318 is x-polarized whereas light beam 319 is y-polarized.

In one implementation, polarized VCSEL substrate 309 has a high refractive index. However, the present disclosure is not limited thereto. Built-in lens structures 316, 317 may change the mode of light beams 318, 319, in some implementations. For example, if light beams 318, 319 are low-order (e.g., zero-order) Laguerre Gaussian modes 321, 322, built-in lens structure 316, 317 may increase the Laguerre Gaussian mode order of the light beams 318, 319. For example, built-in lens structure 316, 317 may increase the mode order from a zero-order Laguerre Gaussian mode to a one to five-order Laguerre Gaussian mode. Accordingly, several discrete elements within transmitter 333 can operate to successively change (e.g., increase) the Laguerre Gaussian mode order of light beams emitted therethrough.

In addition, built-in lens structures 316, 317 may collimate light beams 318, 319. There may be losses as light beams 318, 319 passes through built-in lens structures 316, 317 resulting in light beams 382, 384. Light beams 382, 384 reach diffraction element 313. Diffraction element 313 includes a vortex grating 314 as shown. Light beam 382 passes through vortex grating 314 which changes the Laguerre Gaussian mode order of optical signal to a high-order Laguerre Gaussian mode 323. There may be losses as light beam 382 passes through vortex grating 314 resulting in light beam 324 (which may have light peaks 324a, 324b).

In contrast, light beam 384 passes through a transparent region of diffraction element 313 which allows the light beam 384 to pass therethrough and allows the light beam 384 to maintain its low-order mode 322.

When light beam 324 reaches polarization combiner 188, polarization combiner 188 maintains the direction of high-order light beam 324 in direction 150 towards lens 103 according to its polarization mode (e.g., x-polarized). In contrast, polarization combiner 188 changes the direction of light beam 384 to travel in a 6° direction, for example, until the light beam 384 reaches an end of the polarization combiner 188. Note, the angles shown within the figures may not necessarily be to scale.

Lens 103 focuses light beams 324, 384 into multi-mode optical fiber 104 which is routed to an external system with a receiver that converts the optical signals into electrical signals. In the implementation shown, high-order light beam 324 constitutes a first optical signal whereas light beam 384 constitutes a second optical signal.

It should be understood by one having ordinary skill in the art that VCSEL transmission system 310 may be paired with a receiver system consistent with the present disclosure within a single module to operate as a VCSEL transceiver system.

Figure 8:
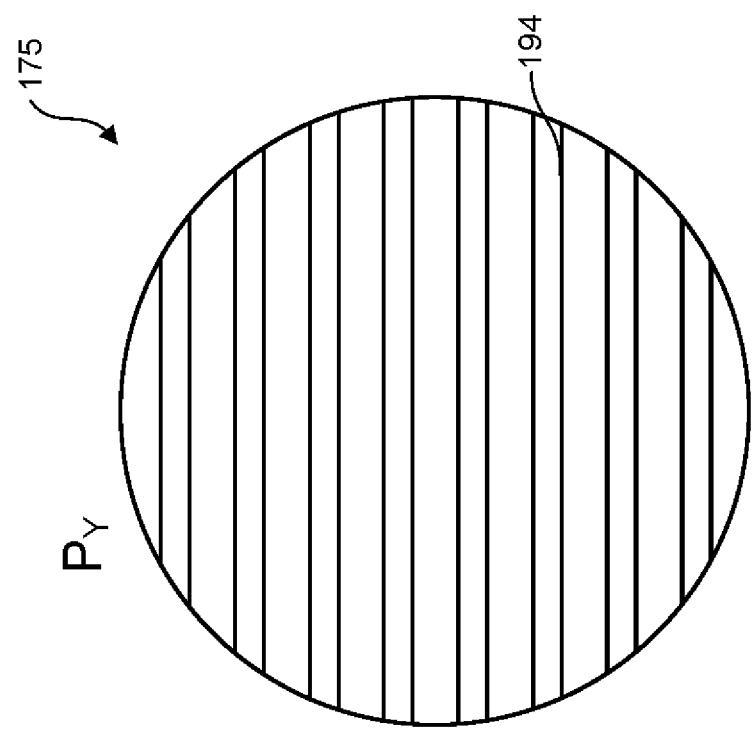
FIG. 8 is a top view of two orthogonal mode high contrast gratings implemented in the polarized VCSEL terminals illustrated in FIG. 7, according to one or more implementations of the present disclosure.
Figure 8:
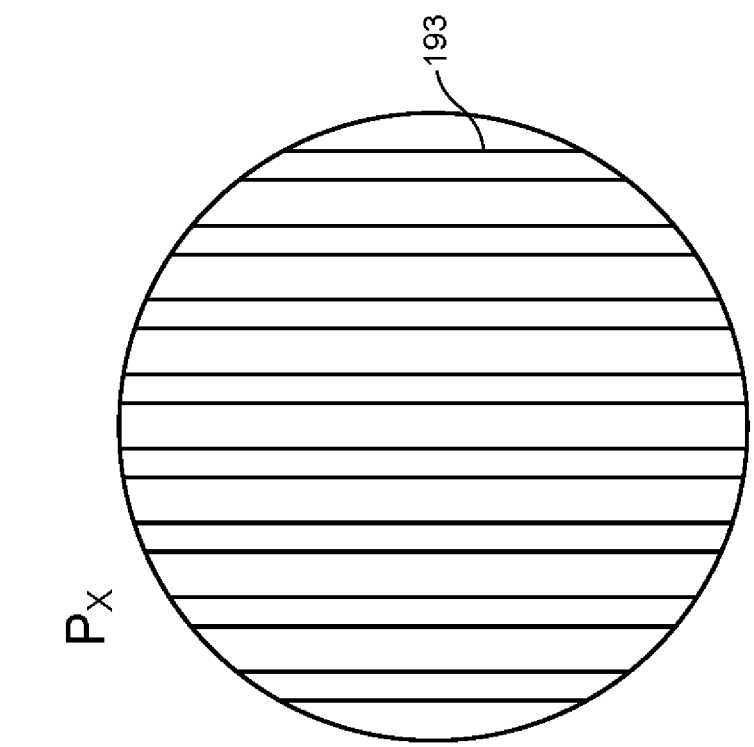

FIG. 8 is a top view of two orthogonal mode high contrast grating implemented in the polarized VCSEL terminals 174, 175 illustrated in FIGS. 7A and 7B. Polarized VCSEL terminal 174 may have a x-polarized orientation 193 such that the light emitted therefrom may maintain a traveling direction through a polarization combiner. Alternatively, polarized VCSEL terminal 175 may have a y-polarized orientation 194 such that the light emitted therefrom may have a different traveling direction as the light travels across a polarization combiner such as polarization combiner 167 (see FIG. 7A).

Figure 9A:
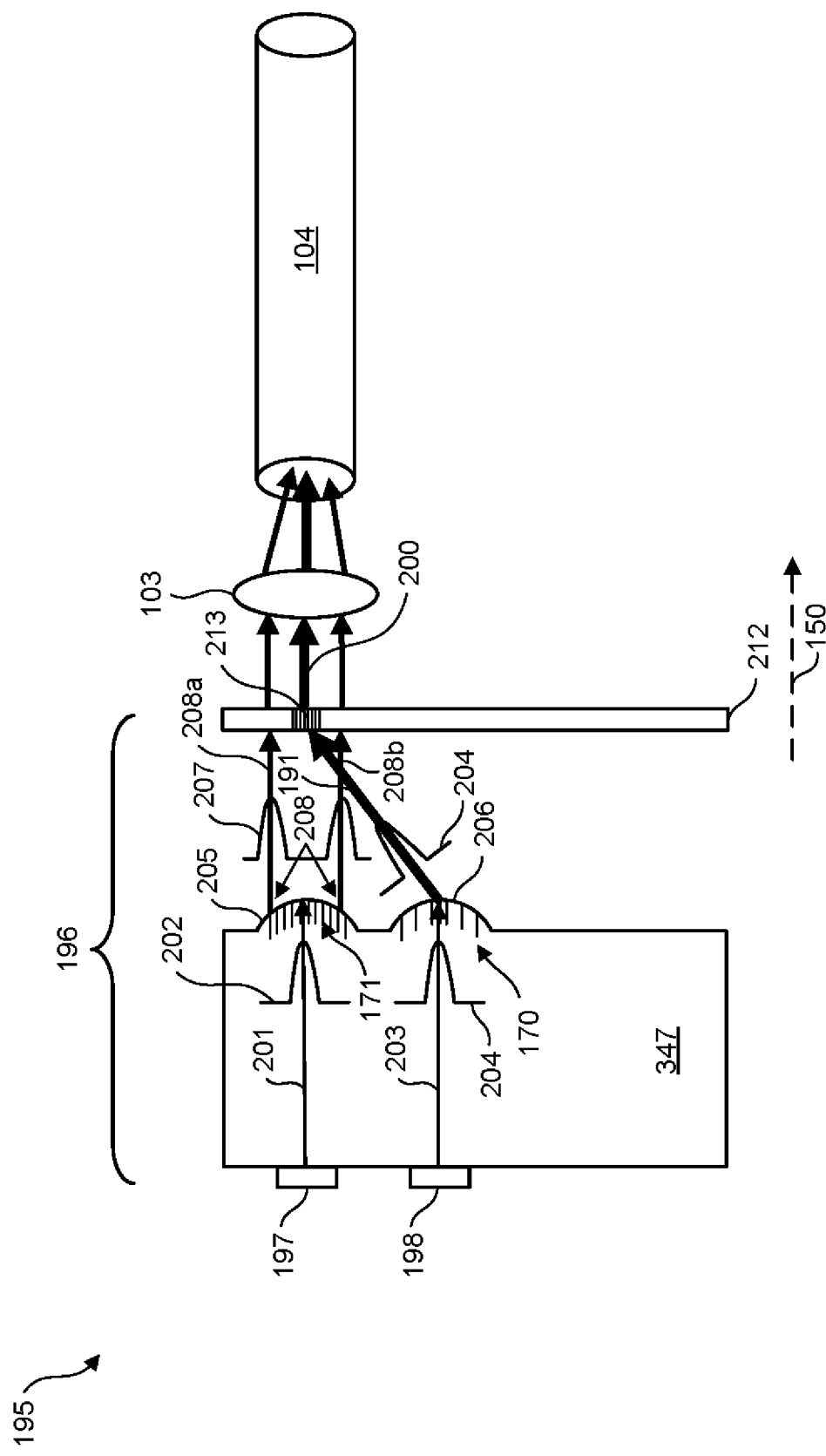
FIG. 9A is an illustration of a VCSEL transmission system which incorporates built-in lens structures within a VCSEL transmitter device, according to one or more implementations of the present disclosure.

FIG. 9A is an illustration of a VCSEL transmission system 195 which incorporates built-in lens structures 205, 206 within a VCSEL transmitter device. VCSEL transmission system 195 includes a transmitter 196 (which includes mode combiner 212), lens 103, and multi-mode optical fiber 104. VCSEL transmission system 195 multiplexes one or more optical signals within the fiber transmission link. As will be described in more detail below, current can be applied to an input of the VCSEL transmission system 195 such that photons are emitted therefrom.

VCSEL transmission system 195 includes VCSEL terminals 197, 198 disposed on a substrate 347 on a first end and built-in lens structures 205, 206 formed into a second end and a mode combiner 212 to receive light directed from built-in lens structures 205, 206.

VCSEL terminal 197 emits light beam 201 in a direction 150 towards built-in lens structure 205. Notably, light beam 201 has a low-order Laguerre Gaussian mode 202. Likewise, VCSEL terminal 198 emits light beam 203 in the direction 150 towards built-in lens structure 206. Light beam 203 also has a low-order Laguerre Gaussian mode 204. Light beams 201, 203 travel through substrate 347 to built-in lens structures 205, 206. In the implementation shown, built-in lens structures 205, 206 have transmission gratings 170, 171, respectively.

In one implementation, the built-in lens structure 206 collimates the light beam 203 into light beam 191. Likewise, built-in lens structure 205 collimates and changes the mode of the light beam 201 as illustrated by high-order Laguerre Gaussian mode 208. Light peaks 208a, 208b constitute a single signal. One having ordinary skill in the art should appreciate that high-order light beam 208 may have a characteristic doughnut shape cross-section in the direction of propagation. Notably, there may be losses as light beam 191 passes through diffraction element 213 resulting in light beam 200. Furthermore, the gratings 171 of built-in lens structure 205 changes the mode of the light beam 201 as it passes therethrough from a low-order Laguerre Gaussian mode to a high-order Laguerre Gaussian mode. The transmission gratings 170 of lens structure 170 changes direction of light beam 203 resulting in light beam 191 while maintaining the low-order Laguerre Gaussian mode 204.

High-order light beam 208 has a high-order Laguerre Gaussian mode 207 as a result of traveling through the built-in lens structure 205. High-order light beam 208 travel in direction 150 through transparent regions of mode combiner 212 through lens 103 which is directed into multimode optical fiber 104. Light beam 191 travels across diffraction element 213 of mode combiner 212. In one implementation, diffraction element 213 includes a transmission grating. Diffraction element 213 changes the direction of light beam 191 such that light beam 191 is directed to lens structure 103 which in turn directs light beam 191 and high-order light beam 208 into multi-mode optical fiber 104.

It should be understood by one having ordinary skill in the art that the VCSEL transmission system 195 may be paired with a receiver system consistent with the present disclosure within a single module to operate as a VCSEL transceiver system. Additionally, or instead, an opposing end of the multi-mode optical fiber 104 opposite the transmission system 195 may be coupled to a receiver system as described herein to form an optical interconnect or link.

Figure 9B:
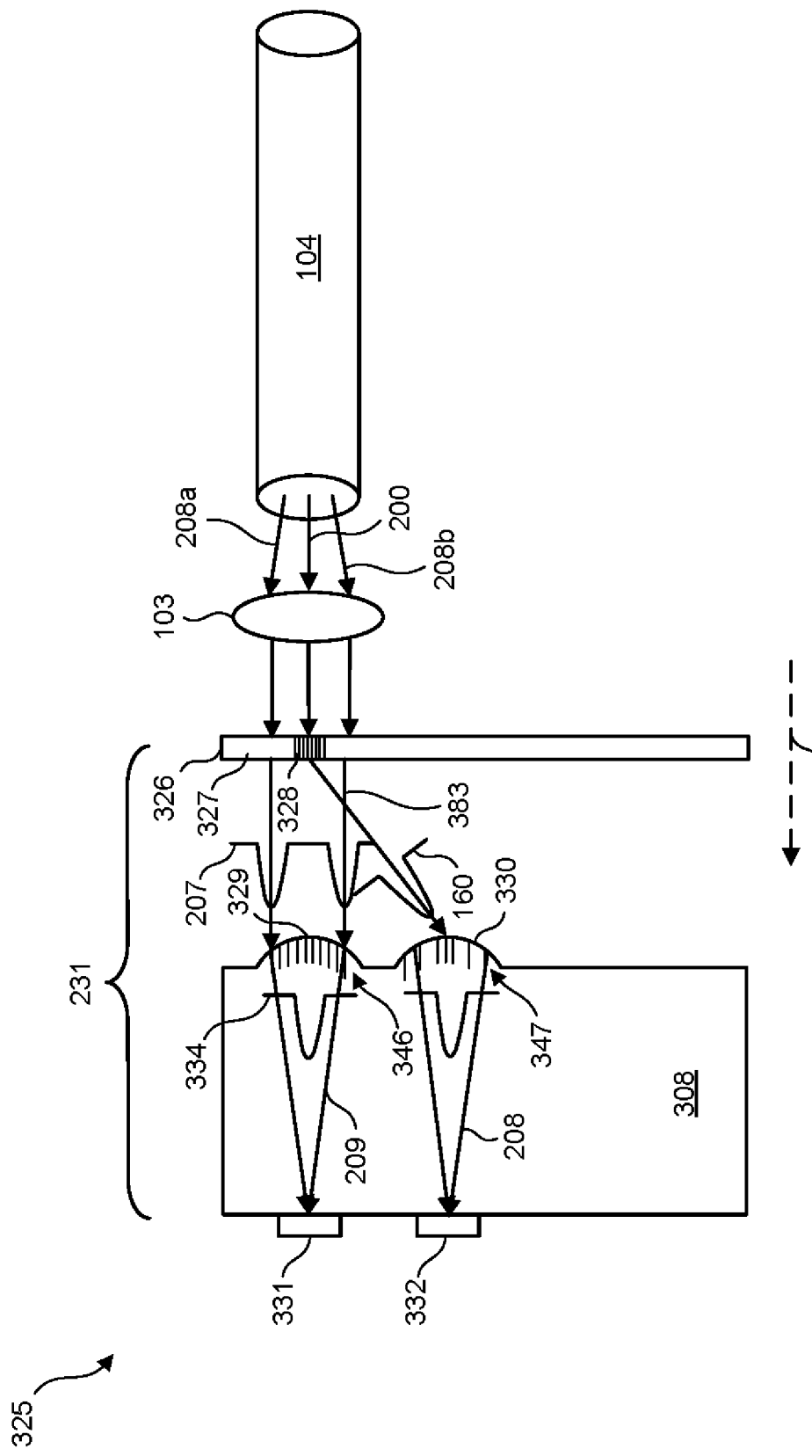
FIG. 9B is an illustration of an example receiver system for the VCSEL transmission system shown in FIG. 9A.

FIG. 9B is an illustration of an example receiver system 325 for the VCSEL transmission system 195 shown in FIG. 9A. Receiver system 325 demultiplexes a plurality of optical signals within a fiber transmission link. Receiver system 325 includes a receiver device 231, lens 103, and multi-mode optical fiber 104. As will be described in more detail below, photons can be applied to an input of the receiver system 325 such that electrical current is emitted therefrom.

The receiver system 325 receives optical signals emitted from a transmitter device (not shown) via a multi-mode optical fiber 104. In the implementation shown, light beams 200, 208 propagate through multi-mode optical fiber 104. In one implementation, high-order light beam 208 comprises light peaks 208a, 208b which constitute a single signal. High-order light beam 208 can be directed to a lens 103 that can direct the high-order light beams 208 to a mode splitter 326 in a direction 151.

Mode splitter 326 includes a transparent region 327 so that high-order light beam 208 can pass therethrough with minimal or no interference. As such, the high-order Laguerre Gaussian mode 207 (e.g., tenth-order Laguerre Gaussian mode) of high-order light beam 208 are maintained until it reaches built-in lens structure 329.

Built-in lens structure 329 which may include transmission gratings 346 can convert light beam 209 from the high-order Laguerre Gaussian mode 207 to a low-order Laguerre Gaussian mode 334. Low-order light beam 209 reaches photodetector 331 which is converted into an electrical signal (e.g., electrical current).

Likewise, light beam 200 is directed from multi-mode optical fiber 104 to lens 103. Lens 103 may direct light beam 200 to diffraction element 328 of mode splitter 326. Diffraction element 328 allows light beam 300 to pass therethrough although there may be losses (e.g., resulting in light beam 383). In the implementation shown, diffraction element 328 is a transmission grating.

Diffraction element 328 changes the direction of light beam 200 towards built-in lens structure 330. In some implementations, there may be losses after light beam 200 passes through diffraction element 328 such that the resulting light beam 383 is directed towards built-in lens structure 330. In the embodiment shown, light beam 383 is shown to have a low-order Laguerre Gaussian mode 160 (e.g., zero-order Laguerre Gaussian mode). As light beam 383 passes through built-in lens structure 330, the built-in lens structure 330 maintains the low-order Laguerre Gaussian mode 160 of the light beam 383 although there may be losses resulting in light beam 208. Once light beam 208 reaches photodetector 332, it is converted to an electrical signal (e.g., electrical current).

The optical signals that are converted to electrical signals by the photodetectors 331, 332 can be read by an external device. Photodetectors 331, 332 can therefore modulate at frequencies up to greater than 100 Gbps and are useful for high-speed communications and precision sensing applications.

Notably, the receiver system 325 may be integrated in a module that also hosts any of the VCSEL transmission systems described herein to operate as a VCSEL transceiver system. For example, receiver system 325 may be paired with the VCSEL transmission system 195 illustrated in FIG. 9A in a single module to operate as a VCSEL transceiver system.

Figure 10A:
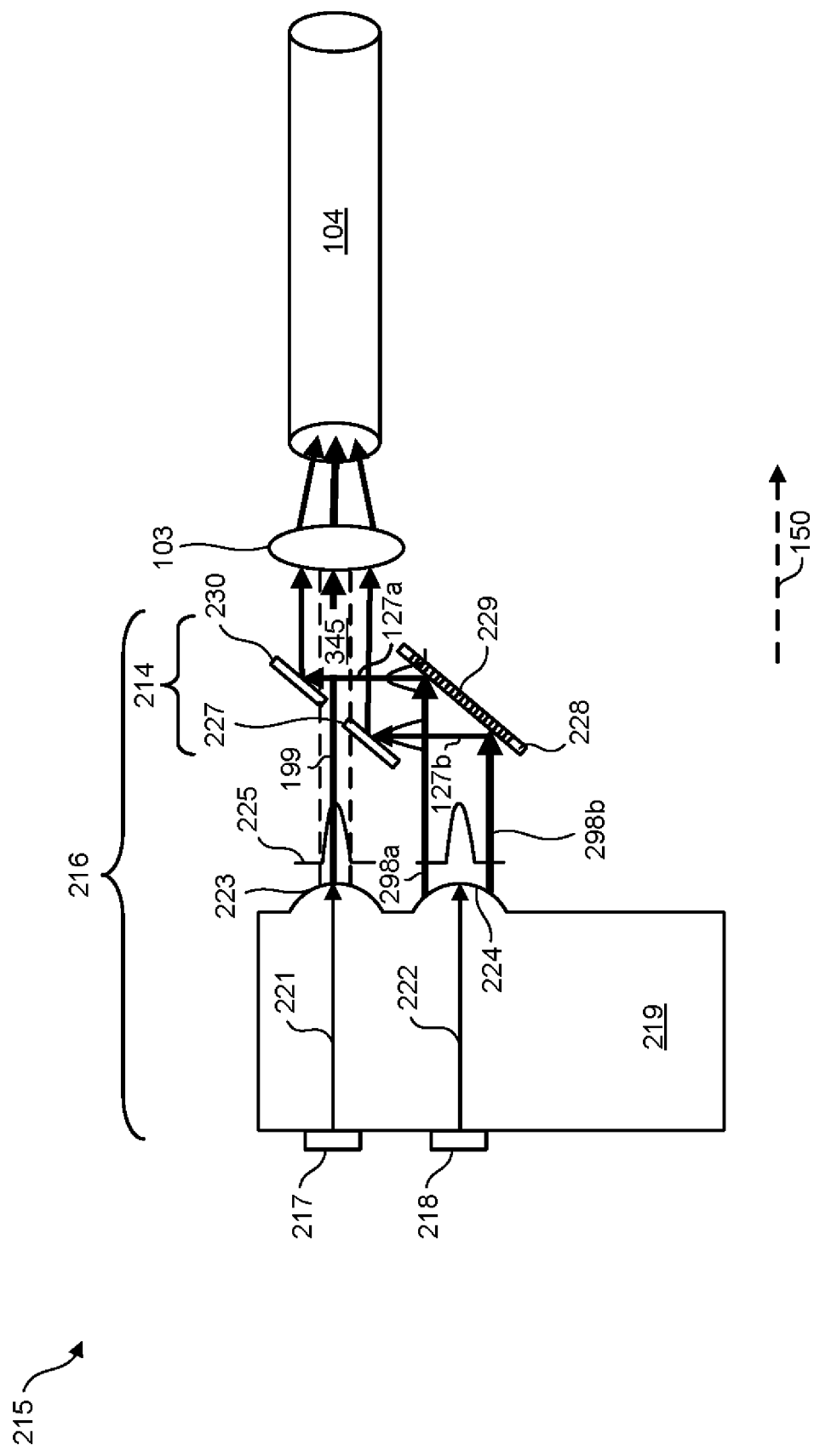
FIG. 10A is an illustration of a VCSEL transmission system which incorporates a multi-reflector assembly, according to one or more implementations of the present disclosure.

FIG. 10A is an illustration of a VCSEL transmission system 215 which incorporates a multi-reflector assembly 214. VCSEL transmission system 215 includes a VCSEL transmitter 216, multi-reflector assembly 214, lens 103, and multi-mode optical fiber 104. In some implementations, the multi-reflector assembly 214 is both a mode converter and mode combiner. The bottom reflector 228 functions as a mode converter and mirrors 227, 230 collectively function as a mode combiner. VCSEL transmitter system 215 can multiplex one or more optical signals within the fiber transmission link. As will be described in more detail below, current can be applied to an input of the VCSEL transmitter system 215 such that photons are emitted therefrom.

In one implementation, a VCSEL transmitter 216 is a bottom-emitting VCSEL based transmitter 216 which employs mode division multiplexing. Notably, multi-reflector assembly 214 is a diffraction assembly which can change the direction or mode of light.

VCSEL transmitter 216 includes VCSEL terminals 217, 218 which emit light beams 221, 222 therefrom. The light beams 221, 222 may have low-order Laguerre Gaussian modes. Light beams 221, 222 propagate through substrate 219 to reach built-in lens structures 223, 224. Built-in lens structures 223, 224 can collimate the light beams 221, 222 that travel therethrough as illustrated by light beams 199, 298. Built-in lens structure 223 can maintain the low-order Laguerre Gaussian mode 225 of light beam 221. Light beam 199 travels through multi-reflector assembly 214 in a direction 150 without contacting any elements therein (or through transparent regions thereof) to lens 103. As illustrated, in some implementations, light beam 199 passes through a hole, aperture, or gap 345 between mirrors 227, 230.

Lens structure 224 diffracts light beam 222. In one implementation, light beam 298 has a low-order Laguerre Gaussian modes. Built-in lens structure 224 also directs light beam 298, having light peaks 298a, 298b, to bottom reflector 228. Notably, bottom reflector 228 has a diffraction element 229 fabricated therein. In the implementation shown, diffraction element 229 includes a reflective grating which reflects photons from light beam 298. Herein, a reflective grating is defined as a diffraction grating which includes a thin metal film deposited on a glass mirrored blank. In alternative implementations, a reflective grating includes a high-contrast grating. The present disclosure may implement both reflective and transmission grating structures.

In some implementations, diffraction element 229 includes a grating. In addition, bottom reflector 228 converts the mode of light beam 298 (e.g., to high-order Laguerre Gaussian mode). In some implementations, light beam 298 experiences losses as the light beam 298 interacts with the diffraction element 229 as illustrated by deflected light beams 127a, 127b.

Accordingly, light beams 127a, 127b are deflected to mirrors 227, 230. Mirror 227 reflects light beam 127a to lens 103 and mirror 230 reflects light beam 127b lens 103. Lens 103 directs light beams 127, 199 into multi-mode optical fiber 104.

It should be understood by one having ordinary skill in the art that the VCSEL transmission system 215 may be paired with a receiver system consistent with the present disclosure within a single module to operate as a VCSEL transceiver system. Additionally, or instead, an opposing end of the multi-mode optical fiber 104 opposite the transmission system 215 may be coupled to a receiver system as described herein to form an optical interconnect or link.

Figure 10B:
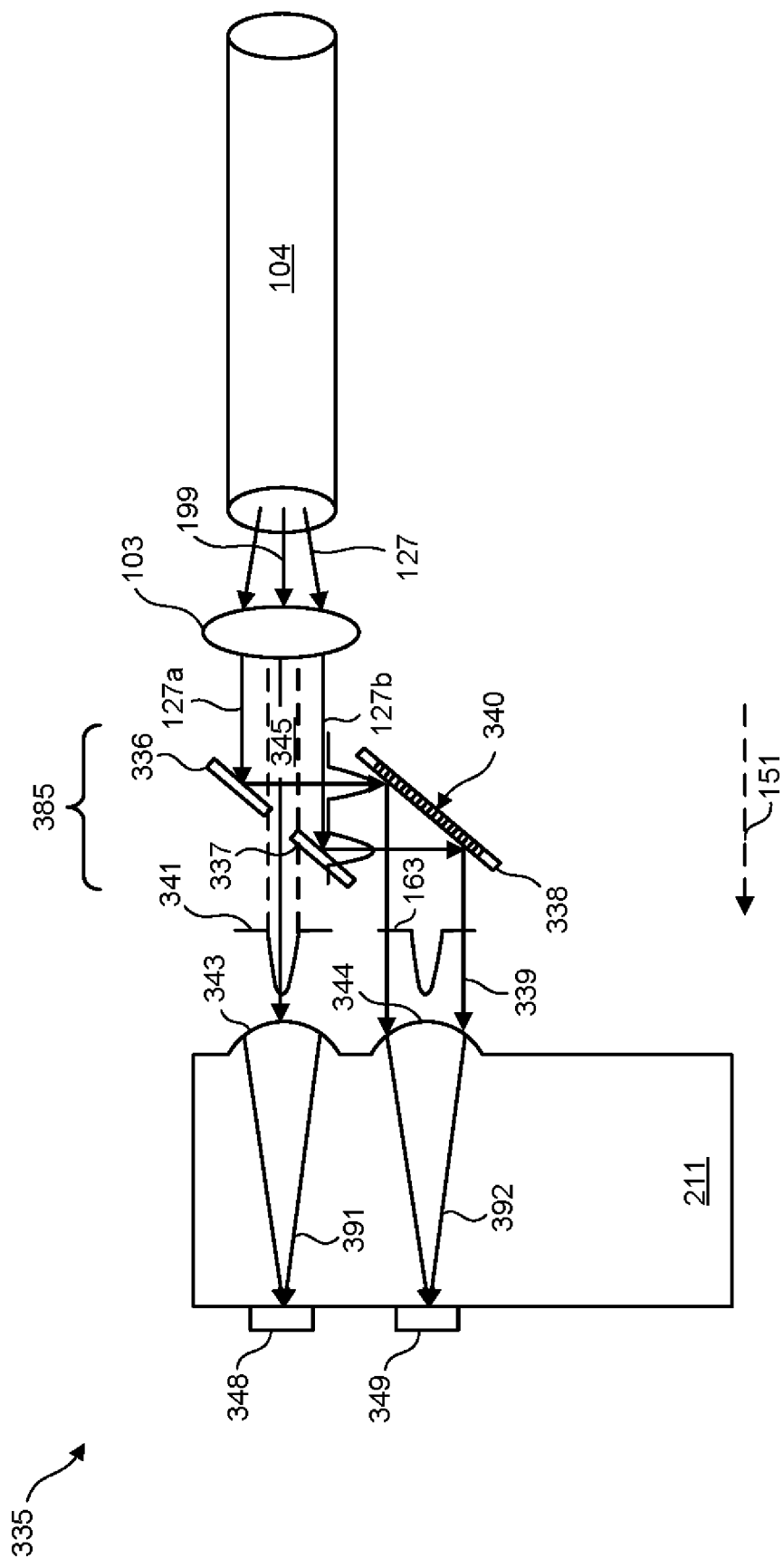
FIG. 10B is an illustration of an example receiver system for the VCSEL transmission system shown in FIG. 10A.

FIG. 10B is an illustration of an example receiver system 335 for the VCSEL transmission system 215 shown in FIG. 10A. Receiver system 335 demultiplexes a plurality of optical signals within a fiber transmission link. Receiver system 335 includes a multi-reflector assembly 385, lens 103, and multi-mode optical fiber 104. As will be described in more detail below, photons can be applied to an input of the receiver system 335 such that electrical current is emitted therefrom.

The receiver system 335 receives optical signals emitted from a transmitter device (not shown) via a multi-mode optical fiber 104. In the implementation shown, light beams 127, 199 propagate through multi-mode optical fiber 104. In one implementation, high-order light beam 127 comprises light peaks 127a, 127b which constitute a single signal. High-order light beam 127 can be directed to a lens 103 that can direct the high-order light beam 127 to a multi-reflector assembly 385 in a direction 151. In addition, low-order light beam 199 can be directed to a lens 103 that can direct the low-order light beam 199 to multi-reflector assembly 385 in the direction 151.

Light peak 127a contacts a first mirror 336 of multi-reflector assembly 385 and light peak 127b contacts a second mirror 337 of multi-reflector assembly 385. Light peaks 127a and 127b of high-order light beam 127a reflect off first mirror 336 and second mirror 337 to bottom reflector 338. In some implementations, bottom reflector 338 has a grating region 340 which changes the mode of high-order light beam 127 to a low-order mode 163. There may be losses as high-order light beam 127 contacts bottom reflector 338 resulting in low-order light beam 339. Low-order light beam 339 reaches built-in lens structure 344 of photodetector substrate 211. In some implementations, built-in lens structure 344 collimates low-order light beam 339. There may be losses as low-order light beam 339 passes through built-in lens structure 344 resulting in low-order light beam 392. Light beam 392 reaches photodetector 349 which converts the optical signal to an electrical signal.

Alternatively, low-order light beam 199 propagates through multi-reflector assembly 385 as directed by lens 343. As illustrated, in some implementations, light beam 199 passes through a hole, aperture, or gap 345 between mirrors 336, 337. In the embodiment shown, low-order light beam 199 maintains its low-order mode 341. In some implementations, built-in lens structure 343 collimates low-order light beam 199. There may be losses as low-order light beam 199 passes through built-in lens structure 343 resulting in light beam 391. Light beam 391 reaches photodetector 348 which converts the optical signal to an electrical signal.

The optical signals that are converted to electrical signals by the photodetectors 348, 349 can be read by an external device. Photodetectors 348, 349 can therefore modulate at frequencies up to greater than 100 Gbps and are useful for high-speed communications and precision sensing applications.

Notably, the receiver system 335 may be integrated in a module that also hosts any of the VCSEL transmission systems described herein to operate as a VCSEL transceiver system. For example, receiver system 335 may be paired with the VCSEL transmission system 215 illustrated in FIG. 10A in a single module to operate as a VCSEL transceiver system.

Figure 11A:
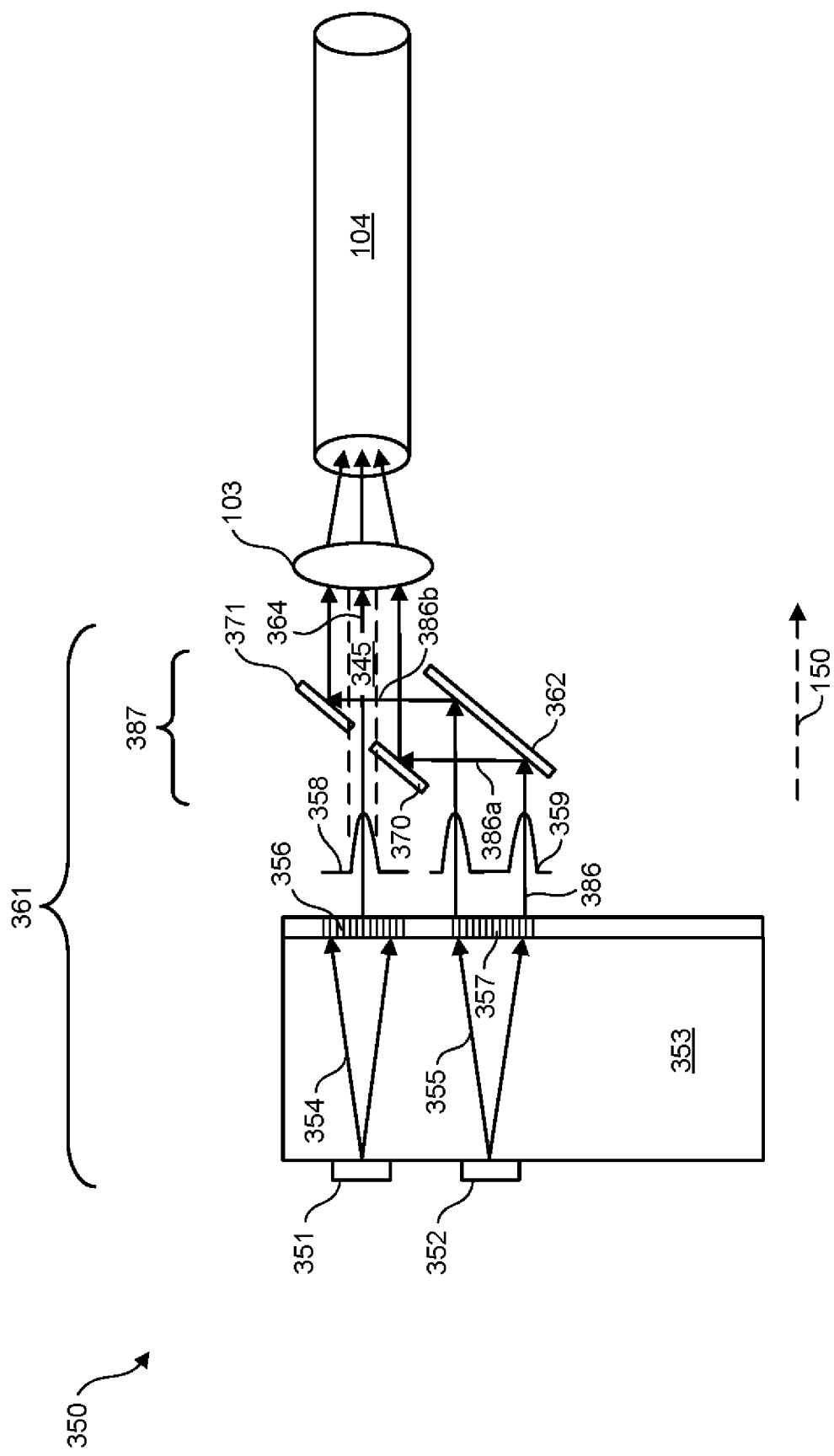
FIG. 11A is an illustration of yet another VCSEL transmission system which incorporates a multi-reflector assembly, according to one or more implementations of the present disclosure.

FIG. 11A is an illustration of yet another VCSEL transmission system 350 which incorporates a multi-reflector assembly 387, according to one or more implementations of the present disclosure. VCSEL transmitter system 350 includes a multi-reflector assembly 387, lens 103, and multi-mode optical fiber 104. As will be described in more detail below, current can be applied to an input of the VCSEL transmitter system 350 such that photons are emitted therefrom.

In one implementation, a VCSEL transmitter 361 is a bottom-emitting VCSEL based transmitter which employs mode division multiplexing. Notably, multi-reflector assembly 387 is a diffraction assembly which can change the direction or mode of light.

VCSEL transmitter 361 includes VCSEL terminals 351, 352 which emit light beams 354, 355 therefrom. The light beams 354, 355 may have low-order Laguerre Gaussian modes. Light beams 354, 355 propagate through substrate 353 to reach grating structures 356, 357. Grating structures 357, in one implementation, can change the order of light beam 355 that travel therethrough as illustrated by high-order Laguerre Gaussian mode 359. As such, light beam 355 is converted to a high-order light beam 386 as it passes through grating structure 357. Light beam 386 reaches multi-reflector assembly 387. A first portion 386a of light beam 386 reflects off bottom reflector 362 to a first mirror 370 whereas a second portion 386b reflects off bottom reflector 362 to a second mirror 371. Light beam 386 is directed by the first mirror 370 and the second mirror 371 to lens 103.

Alternatively, grating structure 356 can maintain the low-order mode 358 of light beam 354. There may be losses as low-order light beam 354 passes through grating structure 356 resulting in low-order light beam 364. Low-order light beam 364 reaches lens 103. In some implementations, low-order light beam 364 passes through a hole, aperture, or gap 345 between mirrors 370, 371.

Lens structure 223 can maintain the low-order Laguerre Gaussian mode 225 of light beam 221. Light beam 199 travels through multi-reflector assembly 214 in a direction 150 without contacting any elements therein (or through transparent regions thereof) to lens 103.

Lens structure 103 directs low-order light beam 364 and high-order light beam 386 into multi-mode optical fiber 104. It should be understood by one having ordinary skill in the art that the VCSEL transmission system 350 may be paired with a receiver system consistent with the present disclosure within a single module to operate as a VCSEL transceiver system. Additionally, or instead, an opposing end of the multi-mode optical fiber 104 opposite the transmission system 350 may be coupled to a receiver system as described herein to form an optical interconnect or link.

Figure 11B:
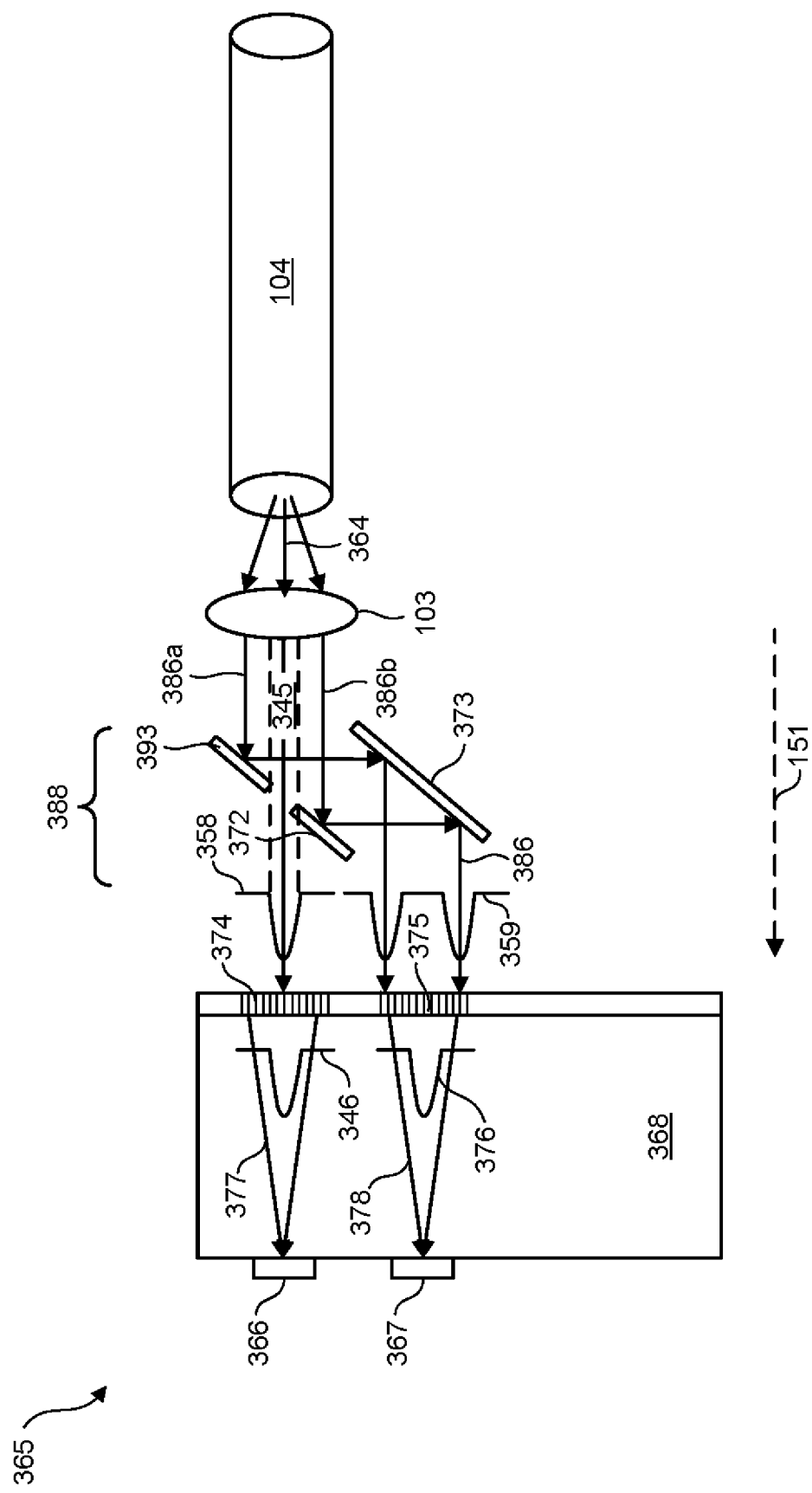
FIG. 11B is an illustration of an example receiver system for the VCSEL transmission system shown in FIG. 11A.

FIG. 11B is an illustration of an example receiver system 365 for the VCSEL transmission system 350 shown in FIG. 11A. Receiver system 365 demultiplexes a plurality of optical signals within a fiber transmission link. Receiver system 365 includes a multi-reflector assembly 388, lens 103, and multi-mode optical fiber 104. As will be described in more detail below, photons can be applied to an input of the receiver system 365 such that electrical current is emitted therefrom.

The receiver system 365 receives optical signals emitted from a transmitter device (not shown) via a multi-mode optical fiber 104. In the implementation shown, light beams 364, 386 propagate through multi-mode optical fiber 104. In one implementation, a high-order light beam 386 comprises light peaks 386a, 386b which constitute a single signal. High-order light beam 386 can be directed to a lens 103 that can direct the high-order light beams 386 to a multi-reflector assembly 388 in a direction 151. In addition, low-order light beam 364 can be directed to a lens 103 that can direct the low-order light beam 364 to multi-reflector assembly 388 in the direction 151.

A first portion 386a of high-order light beam 386 contacts a first mirror 393 of multi-reflector assembly 388 and a second portion 386b of high-order light beam 386 contacts a second mirror 372 of multi-reflector assembly 388. First and second portions 386a and 386b of high-order light beam 386 reflect off first mirror 393 and second mirror 372 to bottom reflector 373. In some implementations, bottom reflector 373 maintains the high-order mode 359 of light beam 386. High-order light beam 386 reaches grating structure 375 of photodetector substrate 368. In some implementations, grating structure 375 collimates and changes the mode order, for example to a low-order mode 376, of the light beam 386. There may be losses as low-order light beam 386 passes through grating structure 375 resulting in low-order light beam 378. Low-order light beam 378 reaches photodetector 367 where the optical signal is converted to an electrical signal.

Alternatively, low-order light beam 364 propagates through multi-reflector assembly 388 as directed by lens 103. In some implementations, light beam 199 passes through a hole, an aperture, or gap between mirrors 372, 393. In the embodiment shown, low-order light beam 364 maintains its low-order mode 358 until it reaches grating structure 374. In some implementations, low-order light beam 364 passes through a hole, aperture, or gap 345 between mirrors 372, 393. Grating structure 374 collimates low-order light beam 364 and maintains its low-order mode. There may be losses as low-order light beam 364 passes through grating structure 374 resulting in low-order light beam 377. Low-order light beam 364 reaches photodetector 366 which converts the optical signal to an electrical signal.

The optical signals that are converted to electrical signals by the photodetectors 366, 367 can be read by an external device. Photodetectors 366, 367 can therefore modulate at frequencies up to greater than 100 Gbps and are useful for high-speed communications and precision sensing applications.

Notably, the receiver system 365 may be integrated in a module that also hosts any of the VCSEL transmission systems described herein to operate as a VCSEL transceiver system. For example, receiver system 365 may be paired with the VCSEL transmission system 350 illustrated in FIG. 10A in a single module to operate as a VCSEL transceiver system.

Figure 12:
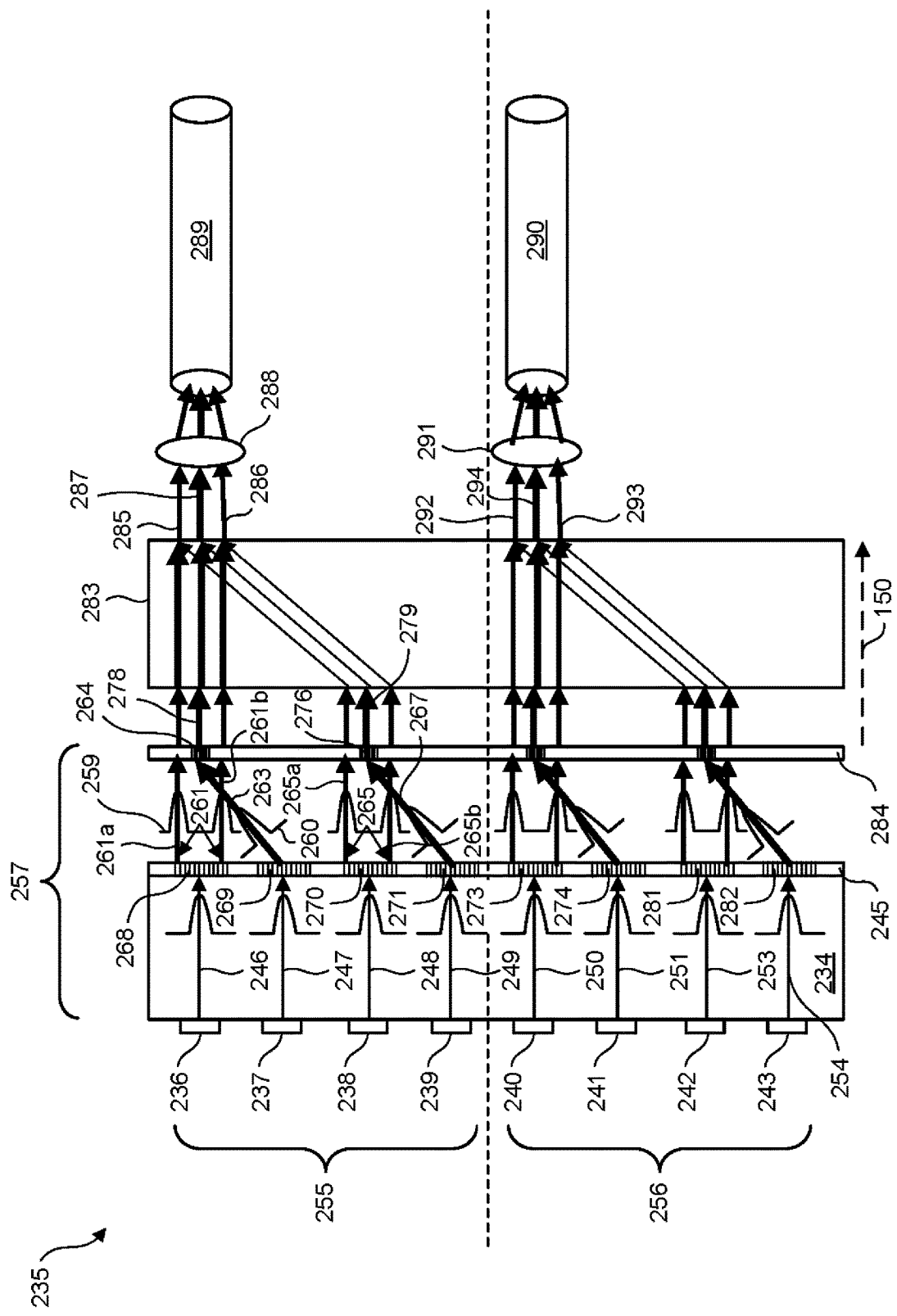
FIG. 12 is an illustration of a VCSEL transmission system which implements mode division multiplexing and wavelength division multiplexing, according to one or more implementations of the present disclosure.

FIG. 12 is an illustration of a VCSEL transmission system 235 which implements mode division multiplexing and wavelength division de-multiplexing. VCSEL transmission system 235 multiplexes one or more optical signals within the multi-fiber transmission link. As will be described in more detail below, current can be applied to an input of the VCSEL transmission system 235 such that photons are emitted therefrom.

Mode division multiplexing notably scales the capacity of a single wavelength carrier by the number of modes in a multi-mode waveguide and is attractive as a cost-effective means for high bandwidth density on-chip communications. Wavelength-division multiplexing can also be used to multiplex a number of optical carrier signals onto a single optical fiber by using different wavelengths of laser light. Advantageously, VCSEL transmission system 235 employs both mode division multiplexing and wavelength division multiplexing to increase the number of signals transmitted through a fiber optic communications system.

VCSEL transmission system 235 includes two quad-channel VCSEL terminals 255, 256. Both quad-channel VCSEL terminals 255, 256 can transmit up to four signals via two modes and two wavelengths over three light beams that are directed into an optical fiber (i.e., multi-mode optical fibers 289, 290). It should be understood by one having ordinary skill in the art that the present disclosure is not limited to a VCSEL transmission system 235 that includes two quad-channel VCSEL terminals 255, 256. VCSEL transmission system 235 may include a plurality of VCSEL terminal pairs such that each pair of VCSEL terminals comprising a first VCSEL terminal that is configured to emit a first light transmission having a first wavelength and a second VCSEL terminal that is configured to emit a second light transmission having a second wavelength, according to one implementation of the present disclosure. In addition, the wavelengths of the respective VCSEL terminals may be the same or slightly different, according to implementations of the present disclosure.

Quad-channel VCSEL terminal 255 has four VCSEL terminals 236-239. In some implementations, the wavelength spacing for each adjacent VCSEL terminals 236-239 (or VCSEL terminals 240-243) is between about 15 nm and 40 nm. VCSEL terminals 236-239 emit light beams 246-249, respectfully. Light beams 246-249 travel through substrate 234 to diffraction elements 268-271 fabricated within one end 245 of the substrate 234. In the implementation shown, diffraction elements 268-271 include transmission gratings.

In one implementation, diffraction elements 268-271 collimates the light entering therethrough. Diffraction element 268 can convert light beam 246 into high-order light beam 261, having peaks 261a, 261b, and can convert the mode of the entering light into a high-order Laguerre Gaussian mode 259. As such, light peaks 261a, 261b constitute a single signal. One having ordinary skill in the art should appreciate that high-order light beam 261 may have a characteristic doughnut shape cross-section in the direction of propagation. Conversely, diffraction element 269 can collimate light beam 247 and maintain the low-order Laguerre Gaussian mode 260 of the light. There may be losses associated with light beam 247 passing through the diffraction element 269 resulting in light beam 263 that is directed towards diffraction element 264. Notably, light beams 261, 263 may have the same or substantially the same wavelength property. For example, the wavelength of light associated with light beams 261-263 is about 1,000 nm.

High-order light beam 261 propagates through transparent regions of mode combiner 284 in direction 150 until they reach wavelength multiplexer 283. In contrast, light beam 263 travels through diffraction element 264 which changes the direction of the light beam such that the resulting light beam 278 (in the case of losses attributed to diffraction element 264) travels to wavelength multiplexer 283 in a parallel manner to high-order light beams 261. As will be explained in more detail below, wavelength multiplexer 283 can multiplex several optical signals and in turn output a single optical output which has several optical signals embedded therein. It should be understood by one having ordinary skill in the art that the present disclosure is not limited to a wavelength multiplexer. The present disclosure may incorporate a PDM, MDM or WDM multiplexer.

VCSEL terminals 238, 239 emit light beams 248, 249 each having a low-order Laguerre Gaussian mode. Notably, light beams 248, 249 have a wavelength of light that is different than the wavelength of light associated with light beams 246, 247. In one implementation, the wavelength of light associated with light beams 248, 249 is about 1,100 nm.

Light beams 248, 249 travel through substrate 234 to diffraction elements 270, 271. Light beam 248 is collimated by diffraction element 270 into high-order light beam 265. In addition, diffraction element 270 changes the mode of the light beam 248 entering into high-order Laguerre Gaussian modes. Furthermore, diffraction element 270 collimates light beam 248 and directs the light in a different direction. Because there may be losses as the light beam 248 interacts with diffraction element 270, a resulting light beam 267 emanates towards diffraction element 276.

High-order light beam 265 passes through transparent regions of mode combiner 284. Light beam 267 passes through diffraction element 276. Because there may be losses associated with passing through a diffraction element 276, a resulting light beam 279 propagates towards wavelength multiplexer 283.

Wavelength Multiplexer 283 pairs light beam 265 with high-order light beam 261 by wavelength multiplexer 283. Accordingly, wavelength multiplexer 283 embeds optical signals associated with high-order light beam 261a and light beam 265a into a single optical output signal 285. In the implementation shown, optical output signal 285 contains two wavelengths of optical signals. Similarly, wavelength multiplexer 283 pairs light beam 261b, 265b by embedding optical signals associated with light beams 261b, 265b into a single optical output signal 286. In the implementation shown, optical signal 286 contains two wavelengths of optical signals. Furthermore, wavelength multiplexer 283 pairs light beam 263 with light beam 279 and embeds optical signals associated with light beams 263, 279 into a single optical output signal 287. In the implementation shown, optical output signal 287 contains two wavelengths of optical signals.

Light beams 285-287 are directed into lens 288 which directs the light beams into multi-mode optical fiber 289. Accordingly, multi-mode optical fiber 289 can transmit up to four signals via two modes and two wavelengths attributed to mode division multiplexing and wavelength division multiplexing.

Quad-channel VCSEL terminal 256 has VCSEL terminals 240, 241, 242, 243 which emit light beams 250-253 into substrate 234. In some implementations, quad-channel VCSEL terminal 256 operates similarly to quad-channel VCSEL terminal 255. Wavelength multiplexer 283 pairs light beams received from the multi-terminal VCSEL transmitter 257 by embedding optical signals into optical output signals 292-294. The optical output signals 292-294 propagate to lens structure 291 which in turn directs the optical output signals 292-294 into multi-mode optical fiber 290.

It should be understood by one having ordinary skill in the art that the multi-mode VCSEL transmission system 235 may be paired with a receiver system consistent with the present disclosure within a single module to operate as a VCSEL transceiver system.

Advantageously, the multi-mode VCSEL transmission system 235 may be implemented within a rack-to-rack computer communication system. The multi-mode VCSEL transmission system 235 may also be implemented within a data center.

Figure 13:
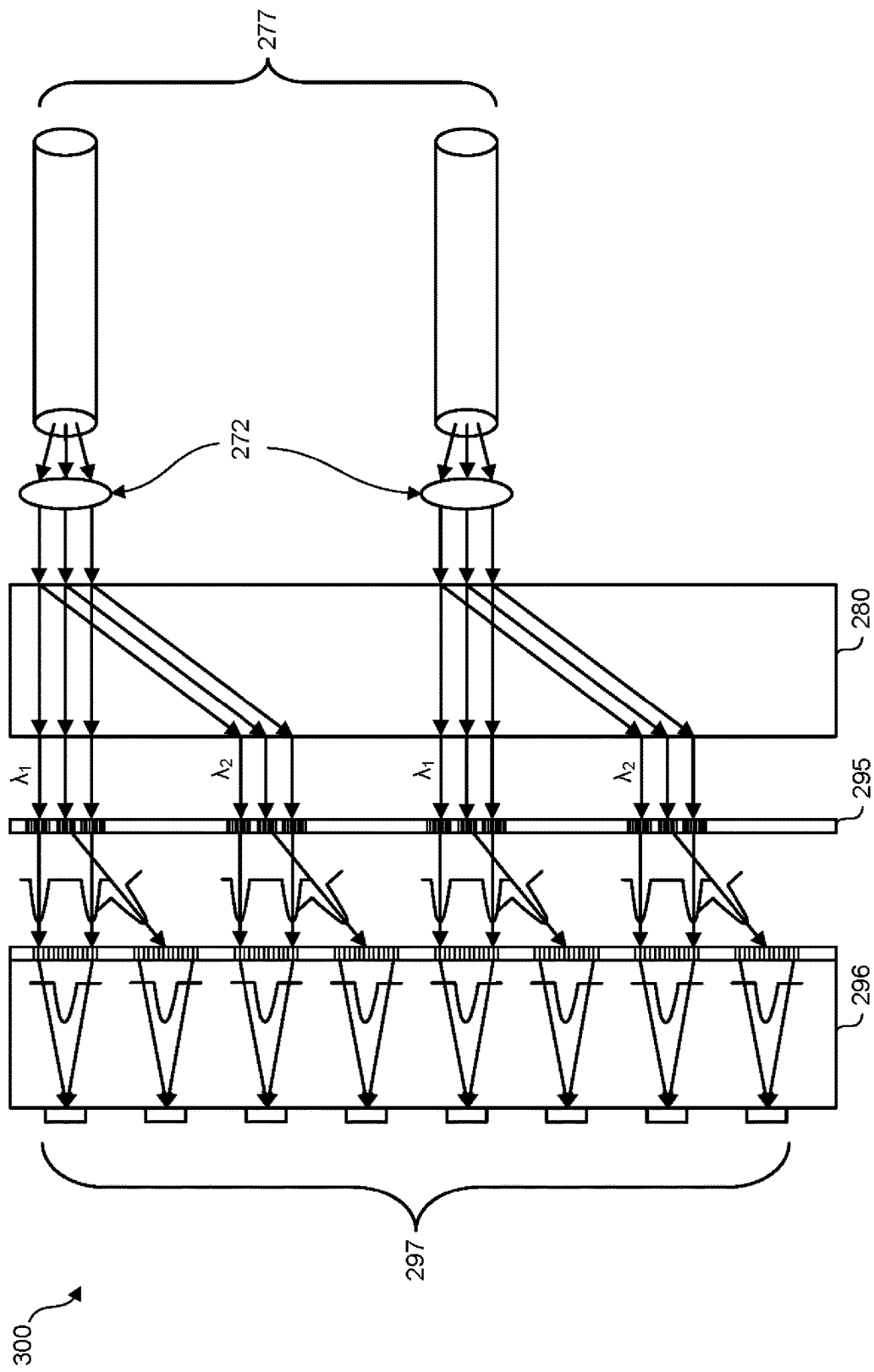
FIG. 13 is an illustration of a receiver system which implements mode division multiplexing and wavelength division multiplexing, according to one or more implementations of the present disclosure.

FIG. 13 is an illustration of a VCSEL system 300 which implements mode division multiplexing and wavelength division multiplexing, according to one or more implementations of the present disclosure. Notably, VCSEL receiver system 300 may be integrated in a module that also hosts the VCSEL transmission system 235 illustrated in FIG. 12.

VCSEL receiver system 300 includes a fiber array 277 which receives and allows the transmission of optical signals. Fiber array 277 can guide the optical signals to lenses 272. The lenses 272 can guide the light to wavelength demultiplexer 280 which in turns directs the light to mode splitter 295. The mode splitter 295 separates the light according to their respective wavelengths such that the light propagates in a direction according to their wavelength. The light eventually reaches the substrate 296 which converts the mode of the light and allows the light to propagate to an array of photodetectors 297. Notably, the photodetectors 297 convert the optical signals to their respective electrical signals.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A vertical-cavity surface-emitting laser (VCSEL) transmitter, comprising:
   a substrate;
   a first VCSEL terminal disposed on a first side of the substrate;
   a second VCSEL terminal disposed on the first side of the substrate and adjacent to the first VCSEL terminal;
   a first diffraction element within a first optical path of the first VCSEL terminal, the first diffraction element to receive and change a first direction of a first light transmission having a low-order Laguerre Gaussian mode emitted from the first VCSEL terminal;
   a second diffraction element within a second optical path of the second VCSEL terminal, the second diffraction element to receive a second light transmission and convert the second light transmission into a high-order Laguerre Gaussian mode; and
   a mode combiner to direct the first light transmission and the second light transmission into a lens.

2. The VCSEL transmitter of claim 1, wherein the VCSEL transmitter is a bottom-emitting VCSEL transmitter.

3. The VCSEL transmitter of claim 1, wherein the mode combiner comprises a first transparent region and a third diffraction element, the first transparent region to allow a transmission of the second light transmission and the third diffraction element to direct the first light transmission into the lens.

4. The VCSEL transmitter of claim 1, wherein the first diffraction element has a Fresnel shape and the second diffraction element has a vortex shape.

5. VCSEL transmitter of claim 1, wherein the low-order Laguerre Gaussian mode is between a zero-order Laguerre Gaussian mode ($L_0$) and a five-order Laguerre Gaussian mode ($L_5$) and the high-order Laguerre Gaussian mode is between an eighth-order Laguerre Gaussian mode ($L_8$) and a fifteenth-order Laguerre Gaussian mode ($L_{15}$).

6. The VCSEL transmitter of claim 1, wherein the first diffraction element comprises a first grating etched within a second side of the substrate and the second diffraction element comprises a second grating etched within a second side of the substrate adjacent to the first diffraction element.

7. The VCSEL transmitter of claim 6, wherein the mode combiner comprises a polarization combiner and wherein the first VCSEL terminal is y-polarized and the second VCSEL terminal is x-polarized.

8. The VCSEL transmitter of claim 7, wherein the polarization combiner comprises at least one of a rutile, calcite, and yttrium orthovanadate material.

9. The VCSEL transmitter of claim 1, wherein the second light transmission emitted from the second VCSEL terminal has a Laguerre Gaussian mode between a second-order Laguerre Gaussian mode ($L_2$) and a sixth-order Laguerre Gaussian mode ($L_6$) and the second diffraction element converts the second light transmission from between the second-order Laguerre Gaussian mode ($L_2$) and the sixth-order Laguerre Gaussian mode ($L_6$) to between an eighth-order Laguerre Gaussian mode ($L_8$) and a fifteenth-order Laguerre Gaussian mode ($L_{15}$).

10. The VCSEL transmitter of claim 1, wherein the second VCSEL terminal comprises a spiral grating, the spiral grating to generate a high-order mode of light.

* * * * *